(12) United States Patent
Nakai et al.

(10) Patent No.: US 11,536,774 B2
(45) Date of Patent: Dec. 27, 2022

(54) COMMUNICATION DEVICE, INFORMATION PROCESSING SYSTEM, INFORMATION PROCESSING METHOD, AND COMPUTER PROGRAM

(71) Applicant: GS Yuasa International Ltd., Kyoto (JP)

(72) Inventors: Keita Nakai, Kyoto (JP); Hitoshi Matsushima, Kyoto (JP); Tomikatsu Uchihori, Kyoto (JP); Tetsuro Matsumoto, Kyoto (JP)

(73) Assignee: GS YUASA INTERNATIONAL LTD., Kyoto (JP)

( * ) Notice: Subject to any disclaimer, the term of this patent is extended or adjusted under 35 U.S.C. 154(b) by 21 days.

(21) Appl. No.: 16/973,715

(22) PCT Filed: Apr. 15, 2019

(86) PCT No.: PCT/JP2019/016091
§ 371 (c)(1),
(2) Date: Dec. 9, 2020

(87) PCT Pub. No.: WO2019/239706
PCT Pub. Date: Dec. 19, 2019

(65) Prior Publication Data
US 2021/0255249 A1    Aug. 19, 2021

(30) Foreign Application Priority Data

Jun. 14, 2018 (JP) .............................. JP2018-113984
Jul. 31, 2018 (JP) .............................. JP2018-144520

(51) Int. Cl.
*G01R 31/3842* (2019.01)
*G01R 31/371* (2019.01)
(Continued)

(52) U.S. Cl.
CPC ....... *G01R 31/3842* (2019.01); *G01R 31/371* (2019.01); *G06F 3/147* (2013.01); *H02J 7/0048* (2020.01); *H04B 1/3827* (2013.01)

(58) Field of Classification Search
None
See application file for complete search history.

(56) References Cited

U.S. PATENT DOCUMENTS

2011/0057612 A1* 3/2011 Taguchi .................. B60L 53/30
320/109
2013/0257464 A1 10/2013 Takatsuji
(Continued)

FOREIGN PATENT DOCUMENTS

EP    2 667 474 A2    11/2013
JP    2003-123847 A    4/2003
(Continued)

OTHER PUBLICATIONS

International Search Report (ISR) (PCT Form PCT/ISA/210), in PCT/JP2019/016091, dated Jul. 16, 2019.
(Continued)

*Primary Examiner* — Jas A Sanghera
(74) *Attorney, Agent, or Firm* — McGinn I.P. Law Group, PLLC

(57) ABSTRACT

A communication device is provided with: a first communication part that is connected to an energy storage device or a power supply related apparatus and communicates with the energy storage device or the power supply related apparatus; an acquisition part that acquires information including a state of the energy storage device or the power supply related apparatus on the basis of a set timing; a change acceptance part that accepts a change in the timing and changes the timing; and a transmission part that transmits, at a timing after the change, the information acquired by the acquisition part to a first apparatus by using a second
(Continued)

communication part communicatively connected to the first apparatus.

20 Claims, 19 Drawing Sheets

(51) Int. Cl.
 *H02J 7/00* (2006.01)
 *G06F 3/147* (2006.01)
 *H04B 1/3827* (2015.01)

(56) References Cited

U.S. PATENT DOCUMENTS

| | | | |
|---|---|---|---|
| 2014/0021923 A1* | 1/2014 | Uchida | H02J 7/0016 |
| | | | 320/118 |
| 2014/0111214 A1 | 4/2014 | Sejima | |
| 2016/0027402 A1* | 1/2016 | Yanazume | G06F 3/14 |
| | | | 345/2.3 |
| 2016/0056510 A1 | 2/2016 | Takeuchi et al. | |
| 2016/0105044 A1* | 4/2016 | Yamaguchi | H01M 10/482 |
| | | | 320/112 |
| 2016/0356856 A1 | 12/2016 | Hongo | |
| 2016/0370431 A1 | 12/2016 | Sejima et al. | |
| 2017/0214266 A1 | 7/2017 | Takahashi et al. | |
| 2018/0095137 A1 | 4/2018 | Yoshioka et al. | |

FOREIGN PATENT DOCUMENTS

| | | | |
|---|---|---|---|
| JP | 2005-227837 | A | 8/2005 |
| JP | 2006-080579 | A | 3/2006 |
| JP | 2007-309839 | A | 11/2007 |
| JP | 2011-158444 | A | 8/2011 |
| JP | 2012-122872 | A | 6/2012 |
| JP | 2014-102248 | A | 6/2014 |
| JP | 2015-038437 | A | 2/2015 |
| JP | 2015-102396 | A | 6/2015 |
| JP | 2015-121520 | A | 7/2015 |
| JP | 2016-012954 | A | 1/2016 |
| JP | 2016-031411 | A | 3/2016 |
| JP | 2016-062561 | A | 4/2016 |
| JP | i 2017-009577 | A | 1/2017 |
| JP | 2017-125680 | A | 7/2017 |
| JP | 2017-192167 | A | 10/2017 |
| JP | 2018-057220 | A | 4/2018 |
| WO | WO 2014/103008 | A1 | 7/2014 |
| WO | WO 2015/072528 | A1 | 5/2015 |
| WO | WO 2015/129321 | A1 | 9/2015 |
| WO | WO 2016/051722 | A1 | 4/2016 |
| WO | WO 2017/038749 | A1 | 3/2017 |

OTHER PUBLICATIONS

Extended European Search Report dated Jul. 6, 2021 for European Patent Application No. 19819959.8-1202.

* cited by examiner

COMMUNICATION DEVICE, INFORMATION PROCESSING SYSTEM, INFORMATION PROCESSING METHOD, AND COMPUTER PROGRAM

TECHNICAL FIELD

The present invention relates to a communication device mounted on/connected to an energy storage device and/or a power supply related apparatus, an information processing system using the communication device, an information processing method, and a computer program.

BACKGROUND ART

An energy storage device is widely used in an uninterruptible power supply, a d. c. or a. c. power supply included in a stabilized power supply, and the like. The use of energy storage devices in large-scale systems to store generated power is expanding. In the present specification, the term "energy storage device" refers to an entire device for performing energy storage. The minimum unit of the energy storage device is referred to as an energy storage cell.

In the uninterruptible power supply, the stabilized power supply, or a power generating system, maintenance activities of the energy storage device are important. There has been proposed a technique for enabling a user or a maintenance person of an energy storage device included in each of these systems to remotely acquire information of the state of charge (SOC) or the life prediction of the energy storage device via a server apparatus.

Patent Document 1 proposes a system in which an operator visually recognizes information on a predicted value of a degradation rate of an energy storage device remotely via a server apparatus and a network. It is known that degradation of an energy storage cell progresses by repeating charge and discharge. In Patent Document 1, by using data of a use condition and a degradation rate, the calculation of the predicted value of the degradation rate, that is, life prediction, is performed remotely.

Patent Document 2 discloses a controller module for remotely monitoring a stationary energy storage device.

PRIOR ART DOCUMENTS

Patent Documents

Patent Document 1: JP-A-2015-121520
Patent Document 2: International Publication No. 2015/072528

SUMMARY OF THE INVENTION

Problems to be Solved by the Invention

In parallel with the spread of the Internet of things (IoT) in society, expectations are rising for achieving remote monitoring of energy storage devices and power supply related apparatuses and achieving convenient value-added services. In remote monitoring, accurate state estimation and life prediction are required. Therefore, measured values of voltage, current, temperature, and the like in the energy storage device or the state of the power supply related apparatus are acquired at a predetermined sampling timing. The higher the frequency of sampling, the more accurately the state of the energy storage device or the power supply related apparatus can be grasped, but the larger the amount of information, the heavier the arithmetic load and the communication load. It is preferable to perform the sampling at an appropriate frequency in accordance with the states of the energy storage device and the power supply related apparatus.

An object of the present invention is to provide a communication device, an information processing system, an information processing method, and a computer program, which are capable of maintaining the accuracy of state determination for an energy storage device or a power supply related apparatus while taking into consideration an arithmetic load and a communication load.

Means for Solving the Problems

A communication device is provided with: a first communication part that is connected to an energy storage device or a power supply related apparatus and communicates with the energy storage device or the power supply related apparatus; an acquisition part that acquires information including a state of the energy storage device or the power supply related apparatus on the basis of a set timing; a change acceptance part that accepts a change in the timing and changes the timing; and a transmission part that transmits, at a timing after the change, the information acquired by the acquisition part to a first apparatus by using a second communication part communicatively connected to the first apparatus.

MODE FOR CARRYING OUT THE INVENTION

Figure 1:
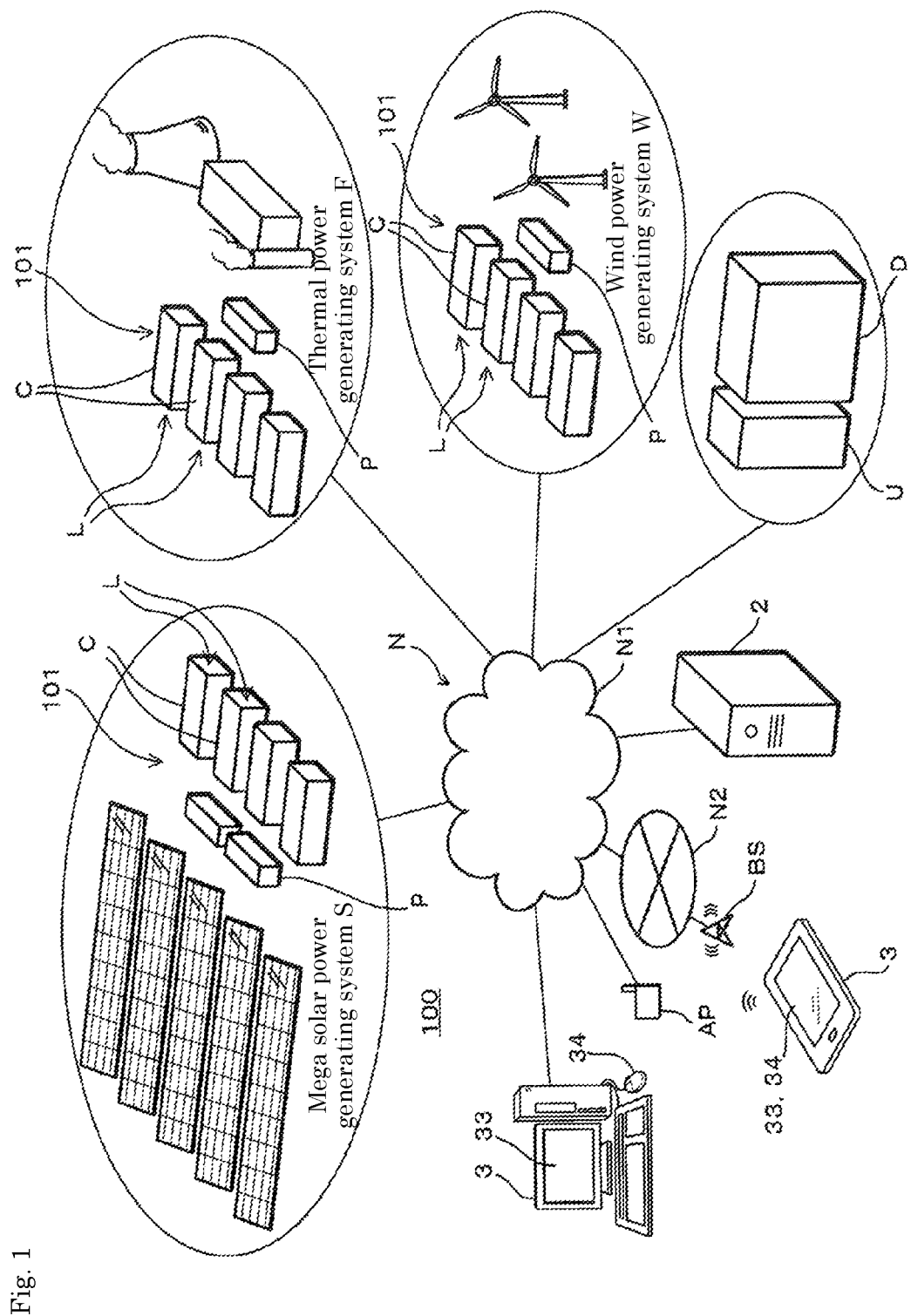
FIG. 1 is a diagram showing an outline of a remote monitoring system.

A communication device is provided with: a first communication part that is connected to an energy storage device or a power supply related apparatus and communicates with the energy storage device or the power supply related apparatus; an acquisition part that acquires information including a state of the energy storage device or the power supply related apparatus on the basis of a set timing; a change acceptance part that accepts a change in the timing and changes the timing; and a transmission part that transmits, at a timing after the change, the information acquired by the acquisition part to a first apparatus by using a second communication part communicatively connected to the first apparatus.

With the above configuration, the change in the timing for acquiring the set information can be accepted by the communication device connected to/mounted on the energy storage device or the power supply related apparatus. The timing can be increased or decreased remotely or reset to the initial setting.

The change acceptance part may transmit, to a second apparatus provided with a display part, screen information serving to display a screen that accepts a change in the timing by using the second communication part, and may accept the change in the timing on the screen displayed by the display part provided in the second apparatus. With this configuration, it is possible to remotely accept a timing change (e.g., manual input) on the screen.

The change acceptance part may receive, by using the second communication part, an instruction to change the timing transmitted from the first apparatus. With this configuration, the timing can be changed (remote operation) by an instruction transmitted remotely.

The instruction for the change may be information created when the information processing apparatus for receiving information from the communication device determines whether or not a timing for information acquisition needs to be changed on the basis of the received information and determines that the change is necessary.

The instruction for the change may be created by determining whether or not the frequency of information acquisition needs to be increased on the basis of learning processing on degradation or detection of a sign of abnormality of the energy storage device or the power supply related apparatus based on information transmitted from the communication device. In this case, when it is determined that the frequency needs to be increased, the instruction part determines the acquisition timing after the change and creates an instruction for the change. With this configuration, it is also possible for the information processing apparatus to autonomously detect a sign, acquire information frequently when necessary, and accurately determine an abnormality. For the learning processing, various types of processing, such as statistical analysis, regression analysis, and deep learning, can be used.

The information processing apparatus may include a transmission processing part that transmits display information to a request source of information including the state, the display information serving to collectively display information including a state of the energy storage device and/or the power supply related apparatus for each of systems including the energy storage device and/or the power supply related apparatus or for each place where the energy storage device and/or the power supply related apparatus are installed. The display information may include information of connection to the communication device that provides screen information serving to display a screen that accepts a change in the timing.

With the above configuration, the information of connection to the communication device can be acquired via the information processing apparatus. A client apparatus having a display part can display a screen that accepts the change in the timing for the information acquisition on the basis of the information of connection. It is possible to remotely change the timing for information acquisition.

An information processing system processes information by a communication device connected to an energy storage device or a power supply related apparatus and an information processing apparatus that transmits and receives information to and from the communication device. In the information processing system, the communication device transmits, to the information processing apparatus, information including the state of the energy storage device or the power supply related apparatus acquired at a timing based on the setting, and the information processing apparatus determines whether or not the timing needs to be changed. When it is determined that the change is necessary, the information processing apparatus transmits to the communication device an instruction to change the timing, and the communication device changes the timing on the basis of the received instruction for the change.

A computer program causes a computer provided with a display part to receive and display information of an energy storage device and/or a power supply related apparatus. The computer program causes the computer to perform the steps of requesting display information for displaying a state of the energy storage device and/or the power supply related apparatus, the display information being provided for each of systems including the energy storage device and/or the power supply related apparatus or for each of places where the energy storage device and/or the power supply related apparatus is installed; collectively displaying the display information for each of the systems or for each of the places on the basis of the display information transmitted in response to the request; communicatively connecting to a communication device on the basis of information of connection to the communication device connected to the energy storage device or the power supply related apparatus included in the display information; and displaying a screen that is provided from the communication device and accepts a change in a timing for acquiring information including the state in the energy storage device or the power supply related apparatus.

The present invention will be described in detail with reference to the accompanying drawings.

First Embodiment

FIG. 1 is a diagram showing an outline of a remote monitoring system 100. The remote monitoring system 100 enables remote access to information concerning energy storage devices and power supply related apparatuses included in a mega solar power generating system S, a thermal power generating system F, and a wind power generating system W. An uninterruptible power supply (UPS) U and a rectifier (d. c. power supply device or a. c. power supply device) D disposed in a stabilized power supply system for a railway, or the like are also monitored remotely. The energy storage device and the power supply related apparatus are not limited to industrial use but may be for household use.

The mega solar power generating system S, the thermal power generating system F, and the wind power generating system W are juxtaposed with a power conditioner (power conditioning system: PCS) P and an energy storage system 101. The energy storage system 101 is configured by juxtaposing a plurality of containers C each housing an energy storage module group L. The energy storage module group L includes a plurality of energy storage devices. The energy storage device is preferably rechargeable, such as a secondary battery like a lead-acid battery or a lithium ion battery, or a capacitor. Apart of the energy storage device may be a primary battery that is not rechargeable.

In the remote monitoring system 100, a communication device 1 is mounted on/connected to each of the energy storage systems 101 or apparatuses (P, U, D, and a management apparatus M to be described later) in the systems S, F, W to be monitored (cf. FIG. 2). The remote monitoring system 100 includes the communication device 1, a server apparatus 2 (information processing apparatus) that collects information from the communication device 1, a client apparatus 3 (communication terminal apparatus) that browses the collected information, and a network N that is a communication medium between the apparatuses.

The communication device 1 may be a terminal apparatus (measurement monitor) that communicates with a battery management unit (BMU) provided in the energy storage device and receives information of the energy storage device or may be an ECHONET/ECHONETLite (registered trademark) compatible controller. The communication device 1 may be a network card type device which can be mounted on the power conditioner P or the energy storage module group L. The communication devices 1 are provided one for each group made up of a plurality of energy storage modules in order to acquire information of the energy storage module group L in the energy storage system 101. A plurality of power conditioners P are connected so as to enable serial communication, and the communication device 1 is connected to a control unit of any representative power conditioner P.

The server apparatus 2 includes a Web server function and presents information obtained from the communication device 1 mounted on/connected to each apparatus to be monitored in response to access from the client apparatus 3. The communication device 1 also includes a Web server function and has an interface configured to set the communication device 1 in response to access from the client apparatus on a Web basis. The interface on which the server apparatus 2 presents information includes a link (connection information) to the interface of the communication device 1, and the client apparatus 3 can remotely operate the communication device 1 by direct communicative connection with the communication device 1.

The network N includes a public communication network N1, which is the so-called Internet, and a carrier network N2 that achieves wireless communication according to a predetermined mobile communication standard. The public communication network N1 includes a general optical line, and the network N includes a dedicated line to which the server apparatus 2 is connected. The network N may include an ECHONET/ECHONETLite compatible network. The carrier network N2 includes a base station BS, and the client apparatus 3 can communicate with the server apparatus 2 from the base station BS via the network N. An access point AP is connected to the public communication network N1, and the client apparatus 3 can transmit and receive information to and from the server apparatus 2 via the network N from the access point AP.

Thus, the remote monitoring system 100 uses the communication device 1 mounted on or connected to each apparatus to be monitored, and the server apparatus 2 collects information such as a SOC, a state of health (SOH), and the like, of the energy storage device in the energy storage system 101, and abnormality detected by the apparatus. The collected information is collectively presented via the server apparatus 2.

Figure 2:
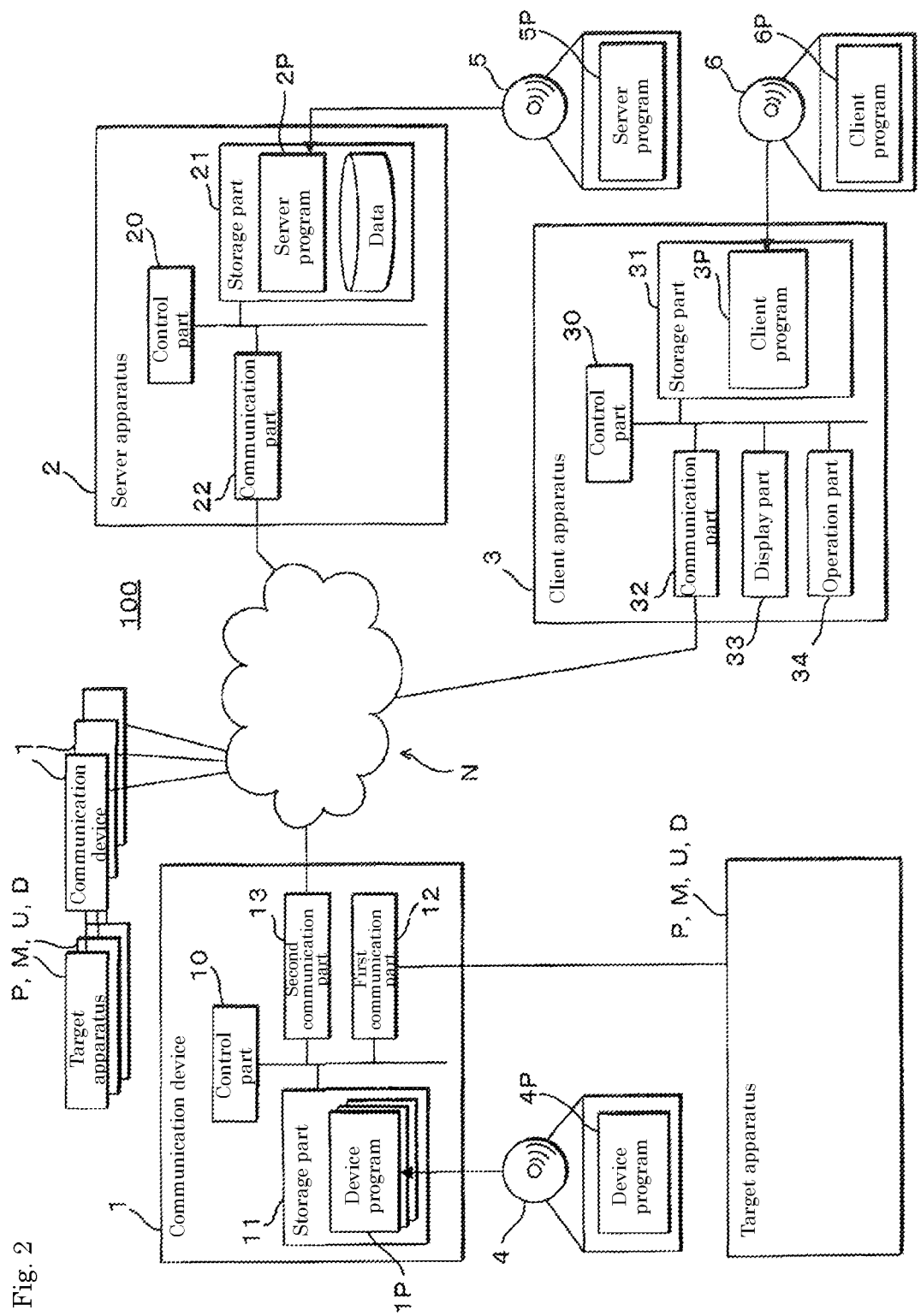
FIG. 2 is a block diagram showing a configuration of the remote monitoring system.

As shown in FIG. 2, the communication device 1 includes a control part 10, a storage part 11, a first communication part 12, and a second communication part 13. The control part 10 is a processor using a central processing unit (CPU) and uses built-in memories such as read-only memory (ROM) and random-access memory (RAM) to control each component part and execute processing.

The storage part 11 uses a nonvolatile memory such as a flash memory. The storage unit 11 stores a device program 1P to be read and executed by the control unit 10. The device program 1P includes an embedded operating system (OS) using Linux (registered trademark) or the like, a Web server running on the OS, and a communication program based on Secure Shell (SSH), Simple Network Management Protocol (SNMP), or the like. The device program 1P stored in advance in the storage part 11 may be a program obtained by reading a device program 4P stored in advance in a recording medium 4 and copying the program to the storage part 11. The device program 1P may include a mailer program, and when an abnormality occurs, an electronic mail may be automatically transmitted to a preset mail address. These programs may be stored in a memory (ROM) built in the control part 10. A setting of a sampling timing related to collection of information is stored in the storage part 11. The sampling timing is a sampling cycle of one minute or one second, for example. The sampling timing is not limited to a fixed cycle but may be a specific pattern or may be on the basis of an event (changes in measured values of temperature, voltage, current, etc.). The storage unit 11 stores information such as information collected by the processing of the control unit 10 and event logs. The information stored in the storage part 11 can also be read via a communication interface, such as a universal serial bus (USB) having a terminal exposed to a casing of the communication device 1.

The first communication part 12 is a communication interface that achieves communication with a monitoring target apparatus to which the communication device 1 is connected. For the first communication part 12 uses, for example, a serial communication interface, such as RS-232C or RS-485, is used. For example, the power conditioner P includes a control unit having a serial communication function conforming to the RS-485, and the first communication part 12 communicates with the control unit. When a control board provided in the energy storage module group L or a management apparatus (FIG. 3) for controlling the energy storage module is connected by a Controller Area Network (CAN) bus and communicates with each other by CAN communication, the first communication part 12 may be a communication interface based on a CAN protocol. The first communication part 12 may be a communication interface that performs communication based on the ECHONET/ECHONETLite standard.

The second communication part 13 is an interface for achieving communication via the network N and uses, for example, a communication interface such as an Ethernet (registered trademark) or a wireless communication antenna. A communication interface for performing communication based on the ECHONET/ECHONETLite standard may be used. The control part 10 can communicatively connect with the server apparatus 2 or the client apparatus 3 via the network N by the second communication part 13.

In the communication device 1 configured as described above, the control part 10 acquires, via the first communication part 12, various pieces of information including state information of the monitoring target apparatus to which the communication device 1 is connected. By reading and executing a Web server program, the control part 10 can also receive a communication connection from the server apparatus 2 or the client apparatus 3 as a Web server and present information. The control part 10 can remotely receive an operation instruction by SSH. The control part 10 receives, for example, an instruction to change a sampling timing for state acquisition and to shut down. By reading and executing an SNMP program, the control part 10 can also function as an SNMP agent and respond to an information request from the server apparatus 2.

The server apparatus 2 uses a server computer and includes a control part 20, a storage part 21 and a communication part 22. Although the server apparatus 2 is described as one server computer in the present embodiment, the processing may be distributed among a plurality of server computers.

The control part 20 is a processor using a CPU or a graphics processing unit (GPU) and uses built-in memories such as a ROM and a RAM to control each component part and execute processing. The control part 20 executes information processing based on a server program 2P stored in the storage part 21. The server program 2P includes a Web server program, and the control unit 20 functions as a Web server that performs provision of a Web page to the client apparatus 3, reception of a login to a Web service, and the like. The control part 20 can collect information from the communication device 1 as an SNMP server on the basis of the server program 2P.

The storage part 21 uses a nonvolatile memory such as a hard disk or a flash memory. The storage part 21 stores the server program 2P described above and also stores data collected by the processing of the control part 20, the data including the states of the power conditioner P and the energy storage module group L in the energy storage system 101 to be monitored. The server program 2P may be a program obtained by reading a server program 5P stored in advance in a recording medium 5 and copying the program to the storage part 21.

The communication part 22 is a communication device that achieves communication connection and data transmission/reception via the network N. Specifically, the communication part 22 is a network card corresponding to the network N.

The client apparatus 3 is a computer used by an operator of an administrator or a maintenance person for the energy storage system 101 in each of the power generating systems S, F, W. The client apparatus 3 may be a desktop or laptop personal computer or may be a so-called smartphone or tablet type communication terminal. The client apparatus 3 includes a control unit 30, a storage unit 31, a communication unit 32, a display unit 33, and an operation unit 34.

The control unit 30 is a processor using a CPU. The control part 30 causes the display part 33 to display a Web page provided by the server apparatus 2 or the communication device 1 on the basis of a client program 3P including a Web browser stored in the storage part 31.

The storage unit 31 uses a nonvolatile memory such as a hard disk or a flash memory. The storage part 31 stores various programs that include the client program 3P including a Web browser. The client program 3P may be a program obtained by reading a client program 6P stored in advance in a recording medium 6 and copying the program to the storage part 11.

The communication part 32 uses a communication device, such as a network card for wired communication, a wireless communication device for mobile communication connected to a base station BS (cf. FIG. 1), or a wireless communication device corresponding to connection to the access point AP. The control part 30 can communicatively connect with, or transmit and receive information to and from, the server apparatus 2 or the communication device 1 via the network N by using the communication part 32.

The display part 33 uses a display such as a liquid crystal display or an organic electroluminescence (EL) display. The display part 33 displays the image of the Web page provided by the server apparatus 2 by the processing based on the client program 3P of the control part 30. The display part 33 is preferably a display with a built-in touch panel but may be a display without a built-in touch panel.

The operation unit 34 is a user interface, such as a keyboard and a pointing device, capable of input and output with the control unit 30 or a voice input unit. A touch panel of the display unit 33 or a physical button provided in the housing may be used for the operation unit 34. The operation unit 34 notifies information of operation by the user to the control unit 20.

In the remote monitoring system 100 configured as described above, the server apparatus 2 acquires various pieces of information including the states of the power conditioner P, the energy storage module group L (management apparatus M described later), the uninterruptible power supply U, and the rectifier D, periodically from the communication device 1 or in response to a request from the client apparatus 3, and stores the information into the storage part 21. The storage part 21 stores information for identifying an apparatus (P, M, U, D), from which information is acquired, and acquired time information in association with each other. The latest data stored in advance in the storage part 21 and its history are processed by the server apparatus 2 so as to be able to be acquired from the client apparatus 3 on a Web page or acquired (downloaded) as data. The server apparatus 2 can comprehensively present, to the client apparatus 3, information acquired from the energy storage device or each power supply related apparatus by using the communication device 1.

Figure 3:
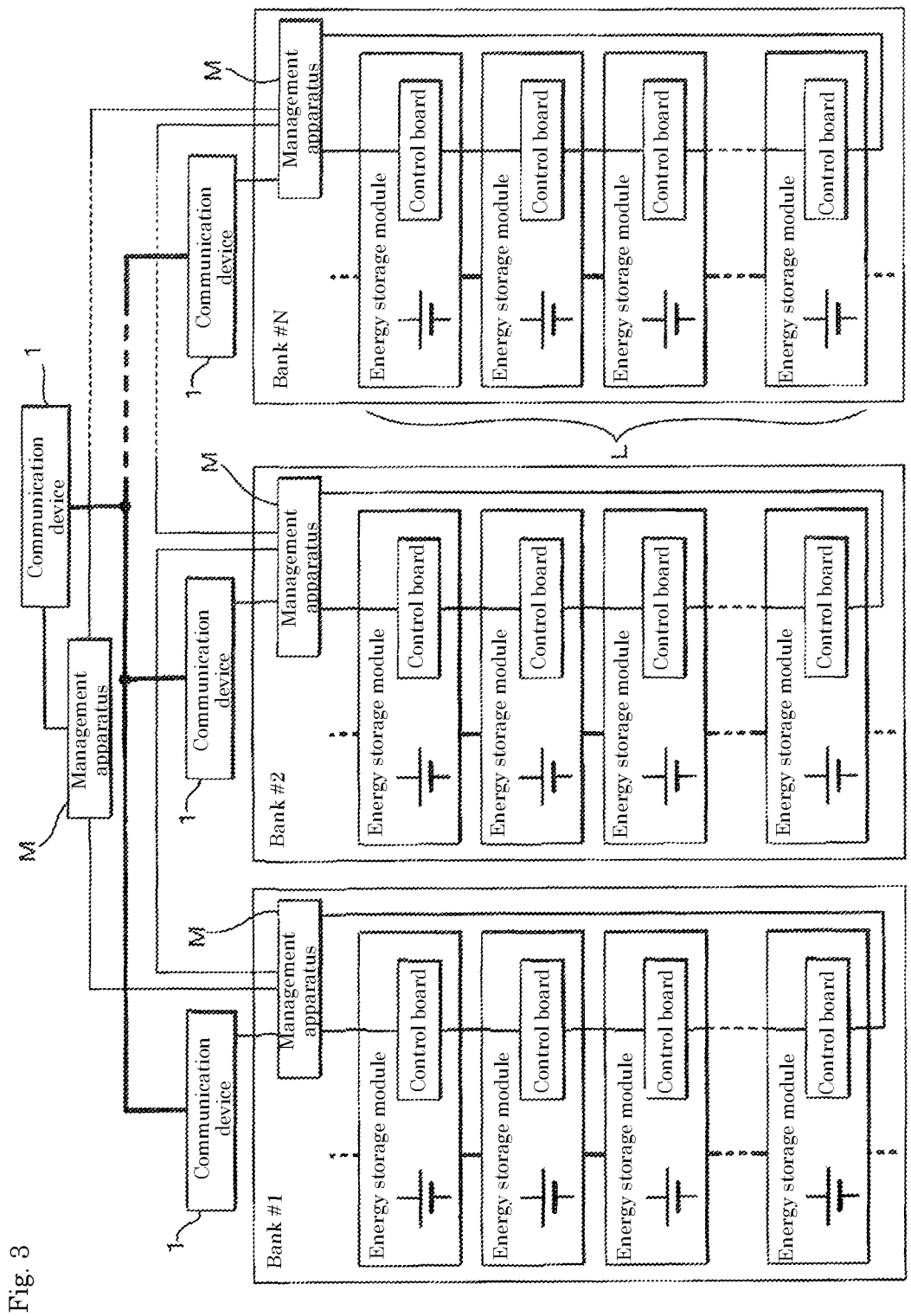
FIG. 3 is a diagram showing an example of a hierarchical structure of an energy storage module group and a connection form of a communication device.

The energy storage module group L has a hierarchical structure. FIG. 3 is a diagram showing an example of the hierarchical structure of the energy storage module group L and the connection form of the communication device 1. The energy storage module group L has a hierarchical structure of, for example, an energy storage module (also referred to as module) in which a plurality of energy storage cells (also referred to as cell) are connected in series, a bank in which a plurality of energy storage modules are connected in series, and a domain in which a plurality of banks are connected in parallel. In the example of FIG. 3, the management apparatuses M are provided one for each of the banks numbered (#)1-N and the domain in which the banks are connected in parallel. The management apparatus M provided for each bank communicates with a control board (cell monitoring unit: CMU) with a communication function built inside each energy storage module through serial communication, and executes management processing, such as the acquisition of the states (current, voltage, temperature) of the energy storage module and the cells inside the energy storage module, balance adjustment for each bank in accordance with each state, and detection of abnormality in the communication-state. The communication connection has been made possible between the plurality of management apparatuses M through CAN communication, a local area network (LAN), ECHONETLite, or serial communication. Each management apparatus M of each bank transmits information of the energy storage module of the bank to the management apparatus M provided in a domain unit. The management apparatus M of the domain collects information obtained from the management apparatus M of the bank belonging to the domain.

In the example of FIG. 3, the communication device 1 is connected to the management apparatus M in a domain unit and the management apparatus M in a bank unit via a communication line or a signal line. The communication devices 1 connected to the respective management apparatuses M are communicatively connected so as to transmit and receive information to and from each other. In the example shown in FIG. 3, the communication devices 1 are connected by a communication bus. The communication bus may be a CAN bus or a LAN cable. The communication device 1 connected to the management apparatus M of the domain may communicate with another communication device 1 connected to the management apparatuses M of other domains in the same system.

Figure 4:
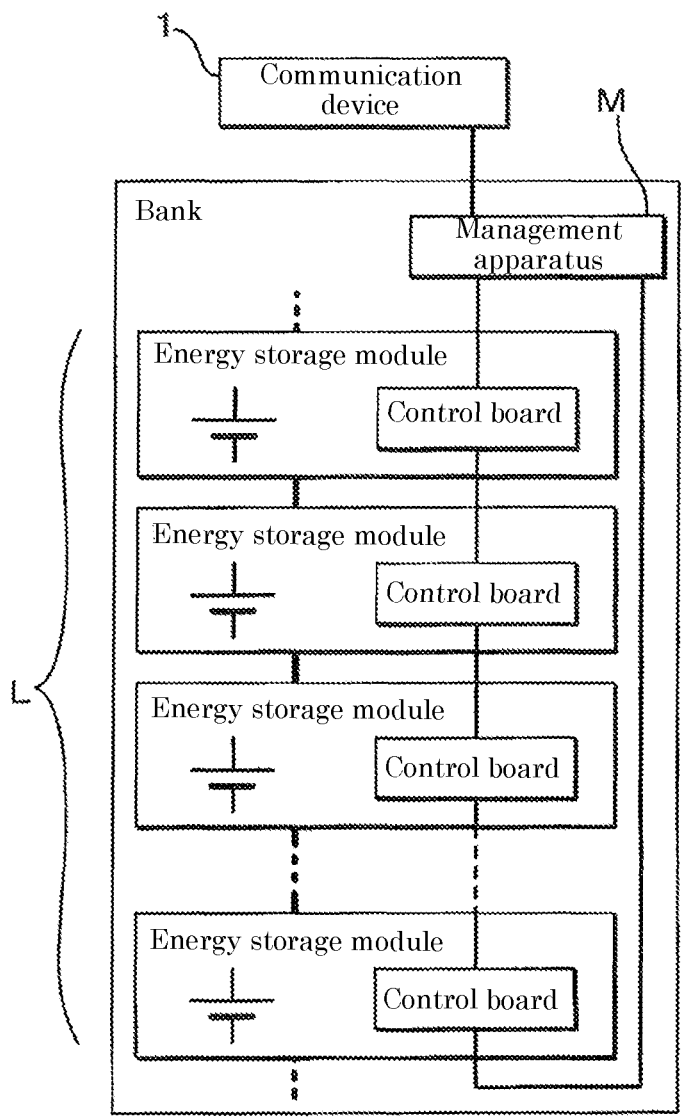
FIG. 4 is a diagram showing another example of the hierarchical structure of the energy storage module group and the connection form of the communication device.

FIG. 4 is a diagram showing another example of the hierarchical structure of the energy storage module group L and the connection form of the communication device 1. In the example of FIG. 4, the energy storage module group L is made up of only one bank (stand-alone) in which a plurality of energy storage modules are connected in series. In the example of FIG. 4, the communication device 1 is connected only to the management apparatus M in a bank unit and does not communicate with the other communication devices 1.

Figure 5:
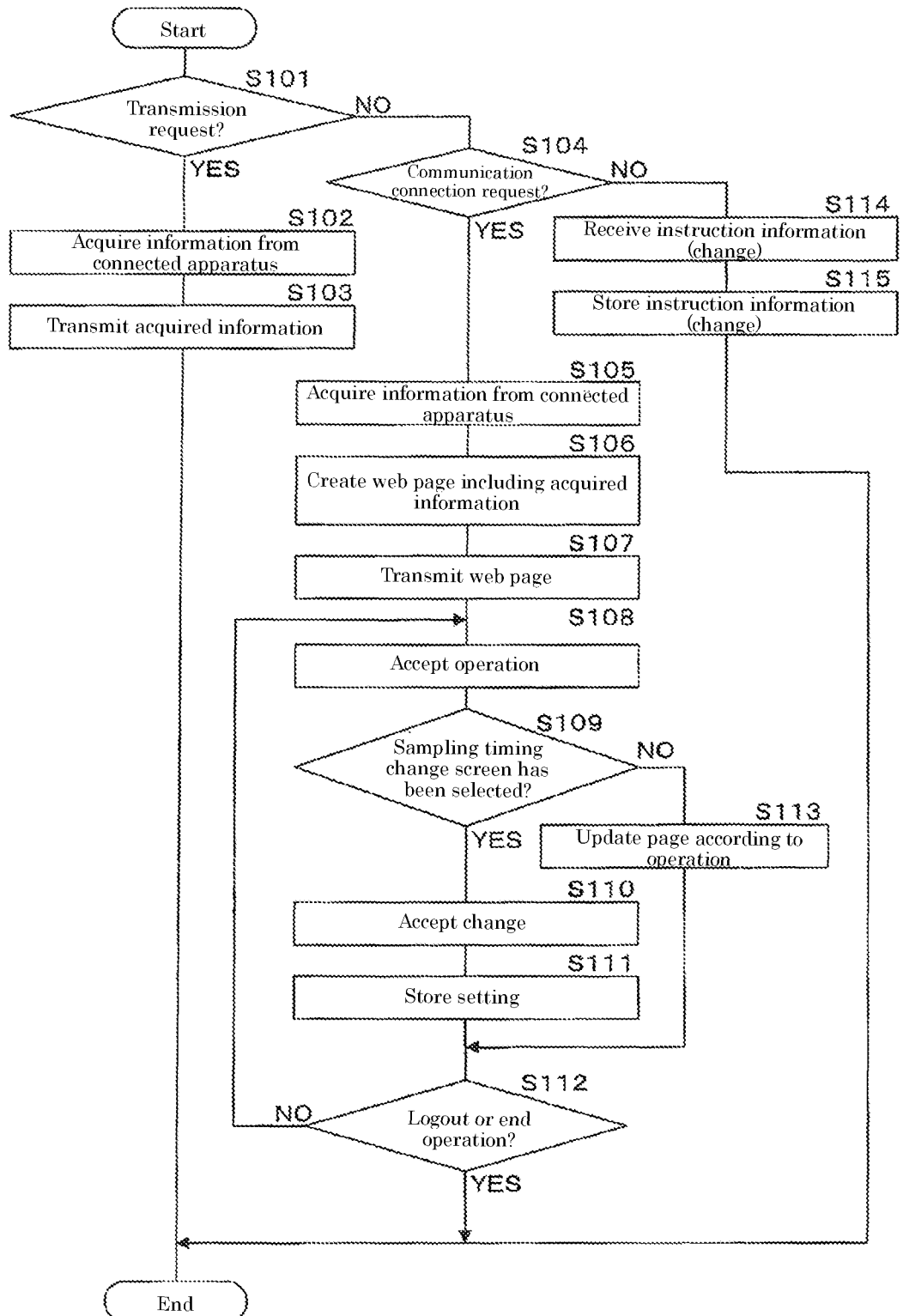
FIG. 5 is a flowchart showing an example of an instruction acceptance procedure in the communication device.

As shown in FIG. 2, the control part 10 of the communication device 1 can accept an instruction to determine the operation of the connected energy storage device or the power supply related apparatus on the basis of the device program 1P stored in the storage part 11. The content of the instruction is, for example, a determination of a sampling timing for state acquisition or is a change in the sampling timing. FIG. 5 is a flowchart showing an example of an instruction acceptance procedure in the communication device 1. The control part 10 of the communication device 1 starts the following processing each time the second communication part 13 detects a communication event from the server apparatus 2 or the client apparatus 3.

The control part 10 determines whether or not the communication event is a request from the server apparatus 2 to transmit information including the state of the energy storage device or the power supply related apparatus (step S101). When it is determined that the request is a transmission request (S101: YES), the control part 10 acquires the latest information from the connected apparatus by using the first communication part 12, or reads and acquires information acquired and stored in advance at a preset sampling timing (step S102, corresponding to the "acquisition part"). The control part 10 transmits information including the acquired state from the second communication part 13 to the server apparatus 2 (step S103, corresponding to the "transmission part"), and ends the processing. The control part 10 may transmit the information acquired by using the first communication part 12 in accordance with a preset schedule (every 10 minutes, 30 minutes, one hour, etc.) without receiving the transmission request in step S101. The control part 10 may transmit information when the information amount (Number or data size) of the stored information reaches a preset upper limit.

When it is determined in step S101 that the communication event is not a transmission request (S101: NO), the control part 10 determines whether or not the communication event is a connection request from the client apparatus 3 (step S104). The connection request is transmitted when browsing of a Web page presented from the communication device 1 is requested. When it is determined that the request is a connection request (S104: YES), the control part 10 acquires the latest information including state information from the connected apparatus by using the first communication part 12 (step S105). The control part 10 creates a Web page including the acquired latest information (updates data contained in a Web page) (step S106) and transmits display information serving to display the created Web page to the client apparatus 3 of a request source from the second communication part 13 (step S107).

The control part 10 accepts an operation on the Web page displayed on the display part 33 of the client apparatus 3 (step S108). It is determined, based on the operation in step S108, whether or not a change screen for the sampling timing has been selected (step S109).

When it is determined that the change screen for the sampling timing has been selected (S109: YES), the control part 10 accepts a change in the sampling timing on the change screen (step S110, corresponding to the "change acceptance part"). The control part 10 stores the accepted change in the sampling timing (sampling timing after the change) into the storage part 11 (step S111) and advances the processing to step S112. The control part 10 preferably accepts a sampling cycle and a period during which the setting is effective as the sampling timing after the change. After the storage processing in step S111, the control part 10 acquires information from the connected apparatus (P, M, U, D) on the basis of the stored sampling timing after the change. A sampling timing of an initial setting is previously stored separately in the storage part 11 and made referable by the control part 10.

When it is determined that the operation is an operation except for the selection of a setting screen for the sampling timing (S109: NO), the Web page is updated in accordance with each operation (step S113), and the processing is advanced to step S112.

The control part 10 determines whether or not a log-out operation or a Web browser ending has been performed by the operation of the operation part 34 in the client apparatus 3 (step S112), and when it is determined that a log-out operation or an ending operation has been performed (S112: YES), ends the processing. When it is determined that the log-out operation or the ending operation has not been performed (S112: NO), the control part 10 returns the processing to step S108 and continues accepting the operation.

When it is determined in step S104 that the request is not a connection request (S104: NO), the communication event is the transmission of instruction information, and the control part 10 receives the instruction information (step S114). The control part 10 stores the received instruction information into the storage part 11 (step S115), operates on the basis of the stored instruction information, and ends the processing. The instruction information may be an instruction to change the sampling timing or may be information instructing the operation of the communication device 1 itself or the operation of a connected apparatus (P, M, U, D). The instruction information may be, for example, a command (script) group.

Figure 6:
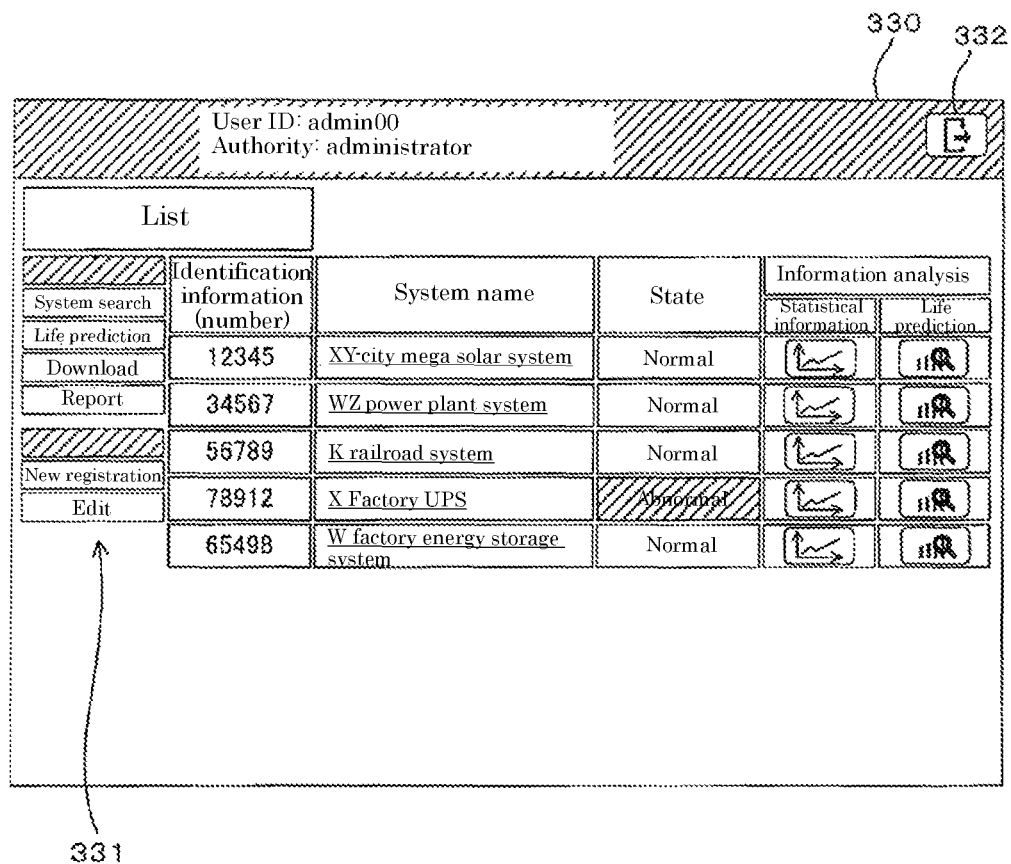
FIG. 6 is a view showing an example of a screen presented by a server apparatus.
Figure 7:
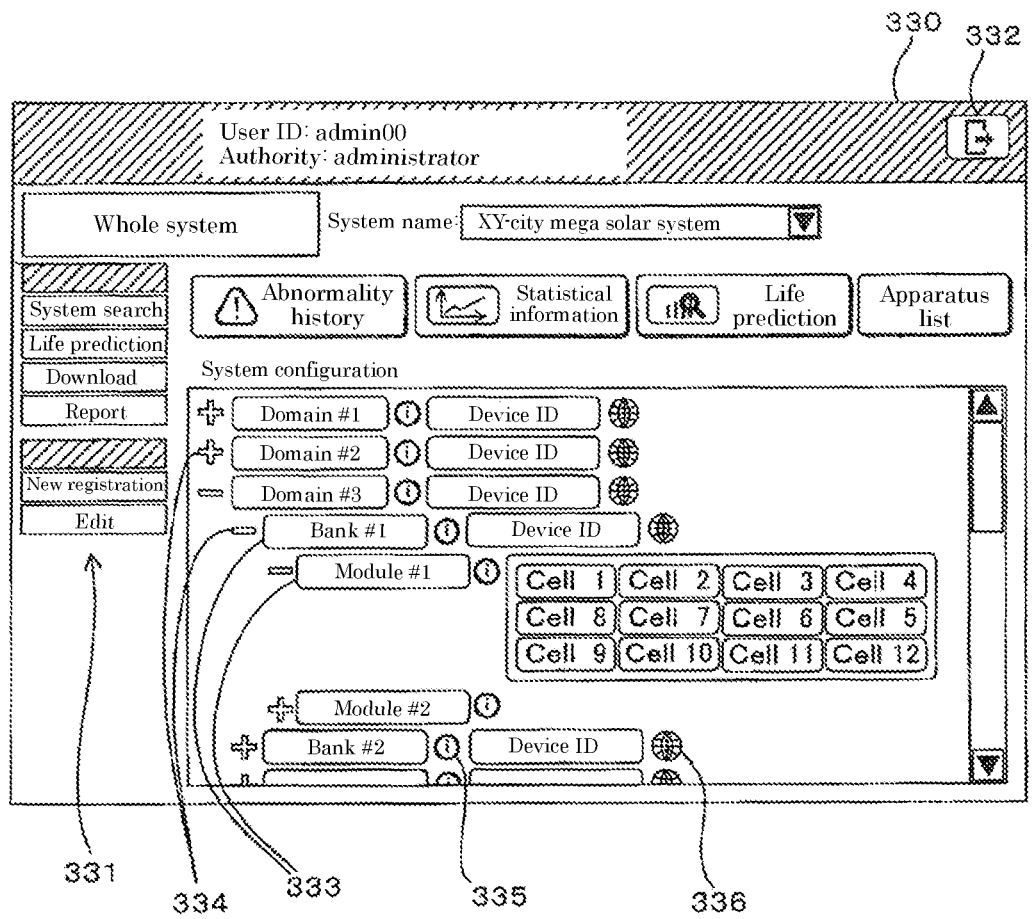
FIG. 7 is a view showing an example of the screen presented by the server apparatus.
Figure 8:
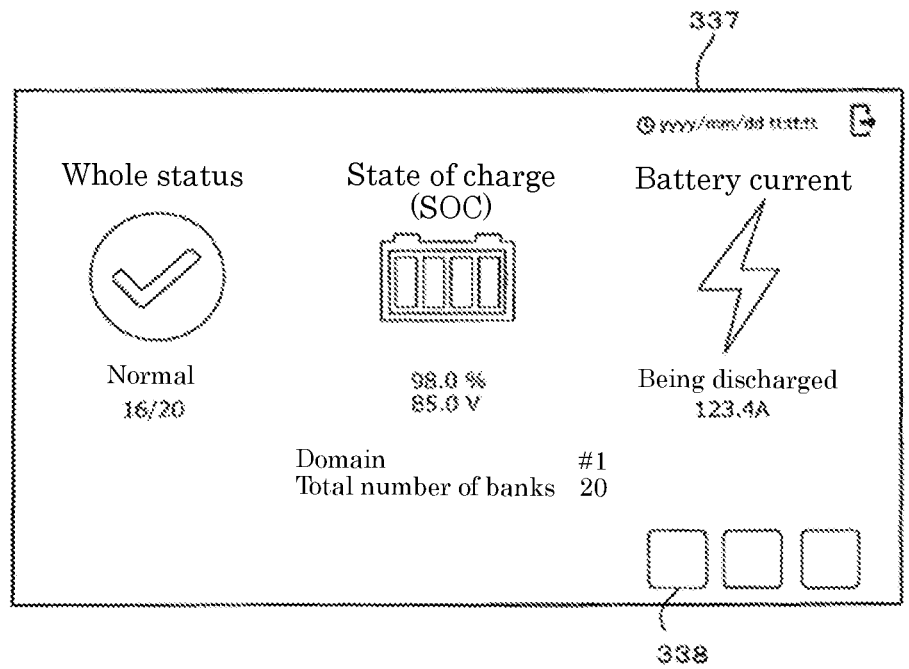
FIG. 8 is a view showing an example of a screen presented by the communication device.
Figure 9:
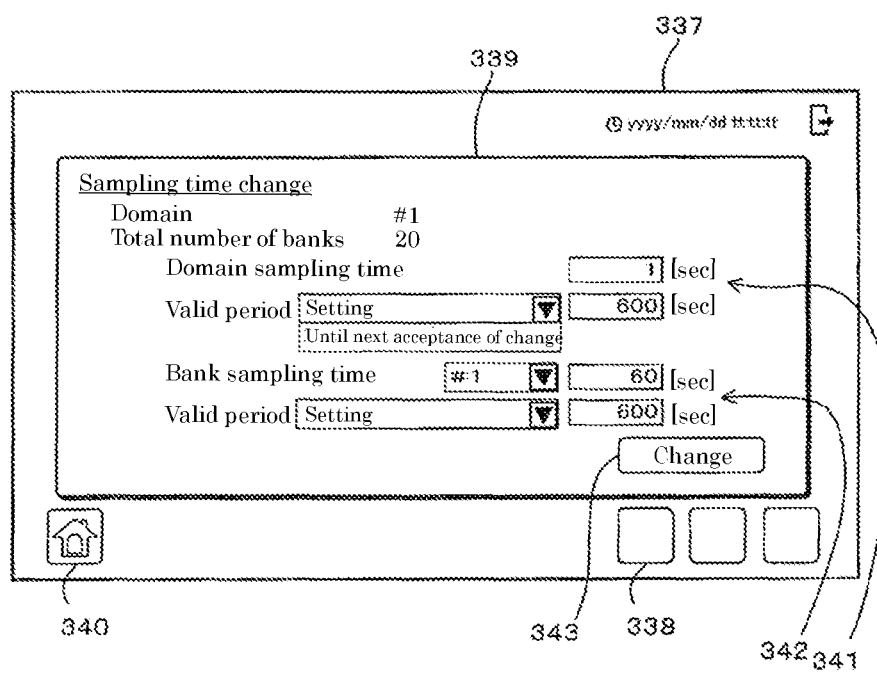
FIG. 9 is a view showing an example of the screen presented by the communication device.

With respect to the processing procedure shown in the flowchart of FIG. 5, an example of a screen displayed on the display part 33 of the client apparatus 3 will be described. FIGS. 6 and 7 are views each showing an example of a screen presented by the server apparatus 2, and FIGS. 8 and 9 are views each showing an example of a screen presented by the communication device 1.

The example of the screen of FIG. 6 is displayed when the user (operator) uses the client apparatus 3 to utilize the remote monitoring system 100, logs in via a login screen provided from the Web server of the server apparatus 2, and succeeds in the login. In the client apparatus 3, on the basis of screen information transmitted from the server apparatus 2, a Web screen 330, including a list of names of systems or apparatuses extracted by the login information, is displayed on the display part 33. In the example of FIG. 6, names "XY-city mega solar system" of the mega solar power generating system S, "WZ power plant system" of the thermal power plant system F, and the like, shown in FIG. 1 are displayed as links together with identification information (identification number).

The Web screen 330 provided from the server apparatus 2 includes menus 331 such as "system search", "life prediction", "download", and "report". The menus 331 include "new registration" and "edit". The Web screen 330 includes a button 332 for log-out or exit operations.

FIG. 7 is a view showing an example of a screen in which information is collectively displayed for each system. FIG. 7 is the Web screen 330 displayed in FIG. 6, which is a screen displayed on the display part 33 when "XY-city mega solar system" is selected by the operation of the operation part 34 of the client apparatus 3. On the example screen of FIG. 7, in accordance with the system configuration of the energy storage system 101 used by "XY-city mega solar system", an icon 333 including a name (or identification number) for identifying each energy storage module group L made up of a plurality of domains each including a plurality of banks is displayed. For the energy storage module group L, a "+/−" icon 334 for expanding or collapsing its hierarchical structure, an icon 335 for displaying detailed information of each energy storage module group L, and an icon 336 for displaying detailed information (real time) are disposed. The icon 336 is disposed together with identification information (device ID) of the communication device 1 connected to the energy storage module group L.

As shown in FIG. 3, the energy storage system 101 of the "XY-city mega solar system" has an energy storage module group L having a plurality of domains each having a plurality of banks in which a plurality of modules each including n cells (n is a natural number and is 12 in the present embodiment) are arranged in series. As shown in FIG. 7, when a "+/−" icon 334 corresponding to a domain is selected on the Web screen 330, a list corresponding to a bank belonging to the domain is expanded. When a "+/−" icon 334 corresponding to a bank in the expanded list is selected, a list of energy storage modules belonging to the bank is expanded. Each energy storage module includes n cells, and when a "+/−" icon 334 corresponding to the energy storage module is selected on the screen 330 by the operation of the operation part 34 of the client apparatus 3, a list (Image) of cells included in the module is expanded as shown in FIG. 7. In FIG. 7, the icons 336 for acquiring detailed information are disposed in each of hierarchies corresponding to the management apparatus M, which the communication device 1 is mounted on/connected to, that is, in both a domain and a bank.

FIG. 8 is a view showing a display example of detailed information. FIG. 8 is an example of a Web screen 337 presented by the Web server of the communication device 1 on the basis of link information associated with an icon 336 when the icon 336 of a hierarchy corresponding to the domain of the energy storage module group L of FIG. 7 is selected. Login is required for displaying the Web screen 337 provided from the communication device 1 as shown in FIG. 8. The login information at this time is common to the login to the Web server provided by the server apparatus 2, and it is preferable that the login information is automatically logged in and displayed without performing an operation for inputting the login information again.

On the Web screen 337, the communication device 1 provides the client apparatus 3 with information obtained from the control board mounted on each energy storage module via the management apparatus M provided in the hierarchy of the domain or the management apparatus M provided in each bank. Specifically, the Web screen 337 includes, as "domain information", the state (normal/abnormal) of the domain, the number of banks (total number of banks) included in the domain, the number of banks operating in all the banks (number of working banks), and the total voltage of the domain, the current, the cell voltage, the SOC, and the temperature distribution (maximum, mean, and minimum values). "Data date and time" is also displayed on the Web screen 337.

The Web screen 337 presented by the communication device 1 includes a plurality of menu icons 338. The plurality of menu icons 338 include, for example, menus for displaying detailed information of "domain information" obtained via the communication device 1. The menu icons 338 include menus for the time in the communication device 1, a setting of a mail address for notification concerning maintenance, a network setting, a setting concerning SNMP, a setting concerning control via serial communication, or a restart (shutdown) of the communication device 1. The menu icons 338 include a menu for manually changing the sampling timing shown in the flowchart of FIG. 5.

The communication device 1 updates the information on the Web screen 337 to be presented in accordance with the content update of the "domain information". The menu icons 338 are selected and operated by the operation part 34 of the client apparatus 3, whereby the communication device 1 transits the Web screen 337.

FIG. 9 is a view showing another example of the Web screen 337 presented from the communication device 1. FIG. 9 shows an example of a screen that is displayed when an icon for changing the sampling timing is selected from the menu icons 338 in FIG. 8. The client apparatus 3 capable of displaying the screen example of FIG. 9 is preferably limited to the client apparatus 3 in which the user (operator) assigned with administrator authority has logged in. As shown in FIG. 9, when the menu icon 338 is selected, a screen 339 superimposed on the Web screen 337 is displayed, and an icon 340 for returning to the Web screen 337 of FIG. 8 is displayed. On the screen 339, the identification number of the domain corresponding to the communication device 1 and its state information (total number of banks included) are displayed.

The screen 339 includes a setting screen 341 for changing the sampling timing for the state information in the domain to which the communication device 1 of the presentation source of the Web screen 337 is connected. The example of the setting screen 341 shown in FIG. 9 includes an input field for the cycle of the sampling timing, a selection field for a valid period of the sampling timing to be changed, and an input field for the valid cycle. With a plurality of banks being included in the lower hierarchy of the domain as shown in FIG. 3, the example shown in the screen 339 includes a setting screen 342 including an input field for the sampling timing and a selection field and an input field for a valid period for each corresponding bank. The screen 339 includes a change button 343. On one or both of the domain setting screen 341 and the bank setting screen 342, when the change button 343 is selected by the operation part 34 after the selection or the input is performed, the change is accepted (S110) and stored (S111). Thus, the change in the sampling timing by the communication device 1 can be accepted remotely and manually via the Web screen 337 presented by the communication device 1.

The Web screen 337 shown in FIG. 9 is presented from the communication device 1 mounted on/connected to the management apparatus M provided in the hierarchy of the domain having a plurality of banks in the lower hierarchy. As described above, on the Web screen 337 shown in FIG. 9, it is also possible to change the sampling timing for the bank in the lower hierarchy including the bank setting screen 342. With this configuration, even when the communication device 1 is provided in the bank, the sampling timing in the lower hierarchy can be changed in the communication device 1 in a higher hierarchy, thereby improving the operability. Even when a plurality of banks are provided in the lower hierarchy, on the Web screen 337 presented from the communication device 1 in the domain hierarchy, the bank setting screen 342 may be invalidated. In this case, the change in the sampling timing for the bank in the lower hierarchy is accepted on the Web screen presented from the communication device 1 that is mounted on/connected to the management apparatus M provided in the bank hierarchy. On the Web screen, only the setting screen 342 of the sampling timing for the corresponding bank (e.g., only "#1" bank) is displayed.

It is also conceivable to set the sampling timing collectively for a plurality of domains in parallel in the same energy storage system 101. In this case, a button for accepting the change in the sampling timing is preferably provided in the Web screen 330 shown in FIG. 7 presented by the server apparatus 2, for example, in the menus 331.

As shown in FIG. 9, it is possible to change different sampling times between the domain and the bank and to set a period during which the changed sampling time is valid.

In this manner, the communication device 1 can remotely accept a change in the sampling timing for acquiring the state of the energy storage device or the power supply related apparatus in the mounted/connected apparatus. It is also possible for the remote monitoring system 100 to automatically change the sampling timing by utilizing the remote acceptance capability. The automatic change will be described below.

A case where the sampling timing needs to be changed from the initial setting is considered to be a case where a need arises for acquiring the state of a part or the whole of the energy storage module group L in detail or a case where, on the contrary, it is determined that the frequency of acquiring the state in detail may be reduced. The former case is a case where a sign of abnormality of a part or the whole of the energy storage module group L is detected on the basis of the state information acquired from each energy storage module and collected by the server apparatus 2 or a case where a degradation rate (lifetime) of the energy storage device is to be calculated. The latter case is a case where the efficiency of processing such as life prediction using the collected and accumulated state information is improved, and processing can be performed while the accuracy is maintained without acquiring the state information at a high frequency. When the frequency of sampling is high, a processing load becomes heavy, and the amount of information including the state transmitted from the communication device 1 to the server apparatus 2 at a timing independent of the sampling frequency becomes large, and a communication load also becomes heavy. Therefore, in consideration of the processing load and the communication load, the frequency of sampling is preferably low so long as the accuracy can be maintained. It is desirable to be able to optimize the frequency of sampling.

Figure 10:
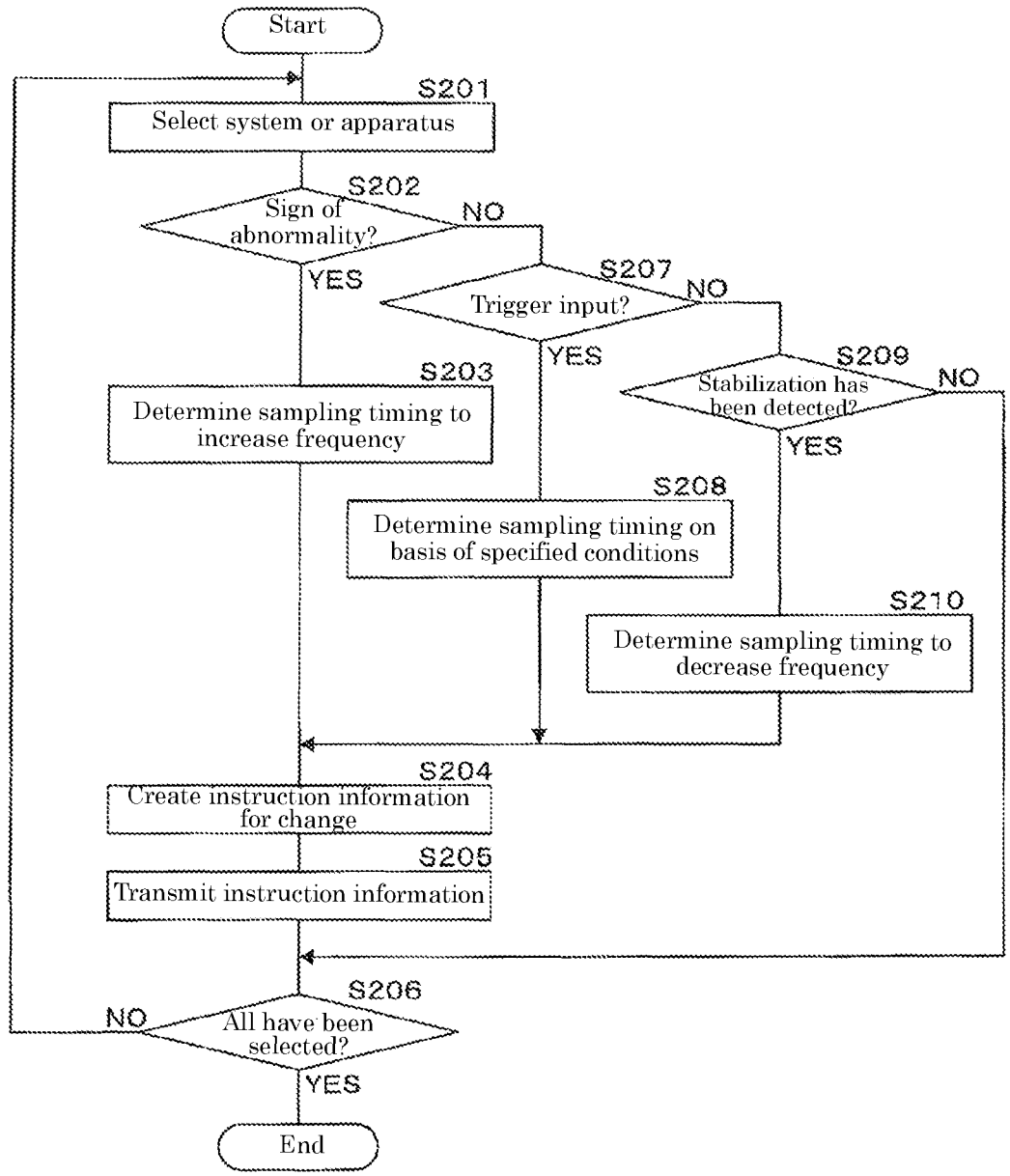
FIG. 10 is a flowchart showing an example of a procedure for processing in the server apparatus.

FIG. 10 is a flowchart showing an example of a processing procedure in the server apparatus 2. The control part 20 of the server apparatus 2 periodically performs the following processing procedure.

The control part 20 selects one system or apparatus to be monitored (step S201). In step S201, the control part 20 selects one piece of the identification information of the system or apparatus to be monitored, the information being stored in advance in the storage part 21. For the selected system or apparatus, the control part 20 determines whether or not a sign of abnormality has been detected on the basis of the state information of the energy storage module group L (step S202, corresponding to the "determination part"). The sign detection may be performed by statistical analysis based on the state information in the server apparatus 2 or threshold determination. The sign detection may be performed on the basis of artificial intelligent determination by learning about degradation or abnormality prediction, based on each acquired state information. The artificial intelligent determination is, for example, deep learning in which state information is used as an input hierarchy, and the state is output as a determination result. Other determinations may be performed by regression analysis on the state information.

When it is determined that a sign of abnormality has been detected (S202: YES), the control part 20 determines a sampling timing after the change so as to increase the frequency of sampling (step S203). The control part 20 creates instruction information that instructs a change, describing the determined sampling timing after the change (step S204), and the control part 20 transmits the created instruction information to the communication device 1 corresponding to the selected system or apparatus (step S205, corresponding to the "instruction part"). The control part 20 determines whether or not selections have been made for all the systems or apparatuses (step S206), and the control part 20 returns the processing to step S201 when determining that the selections have not been made (S206: NO), and ends the processing when determining that the selections have been made (S206: YES).

The processing in step S205 corresponds to steps S114 and S115 in the processing procedure executed by the communication device 1 shown in the flowchart of FIG. 5. When the instruction information instructing the change in the sampling timing is transmitted from the server apparatus 2 as described above, the control part 10 of the communication device 1 receives the instruction information (S114) and stores a change included in the instruction information (S115).

When it is not determined that a sign of abnormality has been detected (S202: NO), the control part 20 determines whether or not a trigger input for changing the sampling timing has been made (step S207, corresponding to the "determination part"). For example, the trigger may be output by the control part 20 itself on the basis of a schedule stored in advance in the storage part 21 in association with the selected system or apparatus or may be output on the basis of a situation determination in an external apparatus based on the peripheral environment of the system, the situations of the other devices, or the like. The trigger may be output by a menu included in the Web screen 330 of FIG. 7 in accordance with an instruction from the client apparatus 3.

When it is determined in step S207 that a trigger input has been made (S207: YES), the control part 20 determines the sampling timing after the change on the basis of conditions specified in correspondence with the trigger input (step S208). The control part 20 creates and transmits instruction information instructing the timing change (S204, S205).

When it is determined in step S207 that no trigger input has been made (S207: NO), the control part 20 determines whether or not a stable state has been detected for the selected system or apparatus on the basis of the state information of the energy storage module group L (step S209, corresponding to the "determination part").

When it is determined that the stable state has been detected (S209: YES), the control part 20 determines the sampling timing after the change so as to reduce the frequency of sampling (step S210). The control part 20 creates and transmits instruction information instructing the timing change (S204, S205) and ends the processing.

When it is determined that the stable state has not been detected (S209: NO), the control part 20 advances the processing to step S206.

The processing procedure shown in the flowchart of FIG. 10 is merely an example. In consideration of the processing load of each communication device 1 and the communication load in the network N, it is preferable to be able to change the sampling timing under various conditions so that the frequency of sampling is optimized in the remote monitoring system 100 as a whole.

Conventionally, in the management apparatus M for managing the energy storage module group L, the sampling timing for acquiring the state of the energy storage device is on the basis of the initial setting, and for changing the sampling timing, a maintenance person visits a site where the management apparatus M is installed to make the change. By utilizing the energy storage module group L and the remote monitoring system 100 capable of remotely monitoring the state of the whole system including the energy storage module group L, the sampling timing can be changed via the communication device 1 in accordance with the operation by the operation part 34 in the client apparatus 3. Hence, it is possible to reduce a burden on the maintenance person and to reduce the cost required for maintenance management.

Second Embodiment

Conventionally, in order to grasp a state of health (SOH) of the energy storage device, measurement by charge and discharge has been performed. There is a case where some energy storage devices are removed from a plurality of energy storage devices in a system where the energy storage devices are mounted or connected (e.g., energy storage system: ESS), and delivered to an energy storage device manufacturer, and the maintenance person measures the capacity of each of some energy storage devices delivered. In this case, the maintenance person charges the energy storage device into a fully charged state and then completely discharges the energy storage device at a predetermined discharge rate (e.g., 1C rate) by using a measuring load, thus enabling correct measurement of the capacity. Alternatively, there is a case where the capacity of the energy storage device is estimated at a place where the energy storage device is installed without separating the energy storage device from the system. In this case, the maintenance person visits the installation place and causes the energy storage device to perform predetermined charge or discharge (e.g., discharge from SOC 80% to 50%) at a rate lower than the predetermined discharge rate by using an actual load of the system. The maintenance person measures the voltage of the energy storage device and integrates the current during discharge while grasping the SOC on the basis of a SOC-OCV (open circuit voltage) curve. The capacity of the energy storage device can be simply estimated by the partial charge and discharge as thus described, not by complete charge and discharge.

The present embodiment relates to a capacity estimation system, a capacity estimation method, and a computer program, which make it possible to remotely grasp a SOH of an energy storage device.

Figure 11:
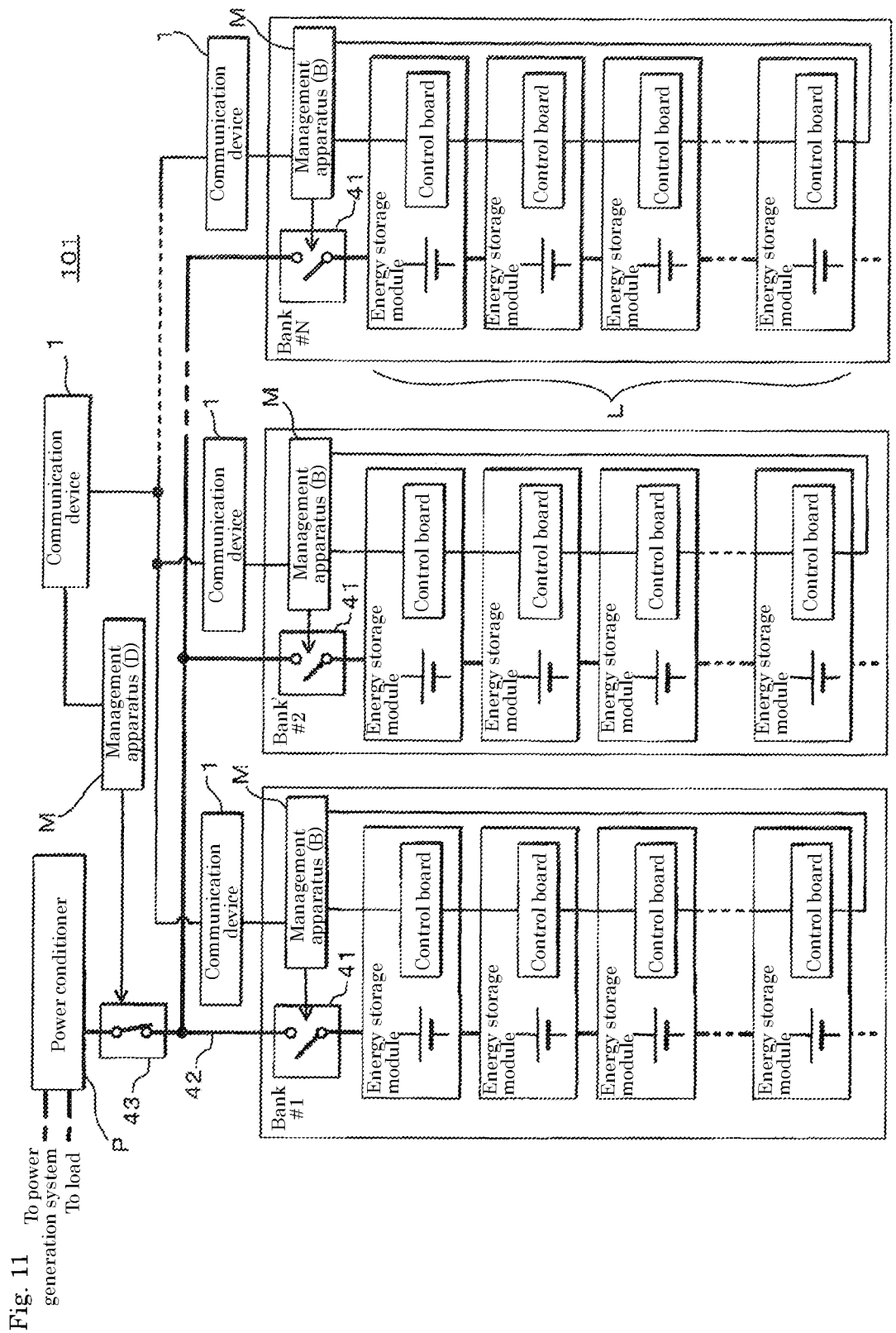
FIG. 11 is a block diagram showing a configuration example of an energy storage system.

FIG. 11 is a block diagram showing a configuration example of the energy storage system 101. The energy storage module group L may have a hierarchical structure of, for example, an energy storage module (also referred to as module) in which a plurality of energy storage cells (also referred to as cell) are connected in series, a bank in which a plurality of energy storage modules are connected in series, and a domain in which a plurality of banks are connected in parallel. The energy storage device in the upper hierarchy in the hierarchical structure is also referred to as an energy storage device unit. For example, the cell or module corresponds to the energy storage device, and the module or bank corresponds to the energy storage device unit. FIG. 11 shows only one domain.

The energy storage system 101 includes the power conditioner P. The power conditioner P supplies power generated by a power generating system, such as a solar system, to the energy storage system 101 and supplies the power stored into the energy storage system 101 to another power consumption facility (load) or power system. The power conditioner P is connected by a power line 42 to a plurality of banks #1-#N in parallel. Between the branch point of the power line 42 to the plurality of banks and the power conditioner P, a switch 43 is provided. By opening and closing the switch 43, the on/off of electric connection from the power conditioner P to the whole domain is switched. The switch 43 may be provided inside the power conditioner P.

Each bank is provided with a switching part 41. The switching part 41 switches the on/off of electric connection to the energy storage module group L from the branch point of the power line 42 to a plurality of banks. The switching part 41 switches between an on-state in which the power line 42 and the energy storage module group L are connected and an off-state in which the power line 42 and the energy storage module group L are not connected. With the energy storage module group L of each bank connected to the power line 42, the energy storage module group L is charged or discharged, that is, electrically connected through the power conditioner P, the switch 43, the power line 42, and the switching part 41. In FIG. 11, the switching part 41 is provided for each bank, but a plurality of banks may be divided into groups, and one switching part 41 may be provided for each group.

In the example of FIG. 11, a management apparatus (battery management unit: BMU) M is provided for each bank unit and each domain unit. In a case where the management apparatus M provided in the bank unit and the management apparatus M provided in the domain unit are separately explained, parentheses are attached to B for the bank and D for the domain for easy description. A management apparatus (B)M for the bank communicates with a control board (cell monitoring unit: CMU) with a communication function built inside the energy storage module by serial communication. The management apparatus M operates by receiving power supply from the power conditioner P, or from the energy storage module group L, via the power line 42.

The management apparatus (B)M is connected to the switching part 41, and the management apparatus (D)M is connected to the switch 43. The switching part 41 and the switch 43 are each controlled by the management apparatus M.

The communication device 1 is connected to the energy storage module group L to be monitored via the management apparatus M. As described above, the communication device 1 is connected to the management apparatus M by the first communication part 12 via a serial communication cable. The communication device 1 may be integrated with the management apparatus M. The communication device 1 operates by receiving power supply through a path different from the power line 42. The plurality of communication devices 1 are communicatively connected to each other so as to transmit and receive information. In the example shown in FIG. 11, the communication devices 1 are connected by a communication bus. The communication bus is, for example, a LAN cable. Alternatively, the communication bus may be a CAN bus, a LAN cable, or an ECHONETLite compatible communication medium. The management apparatus (D)M of the domain and the management apparatuses (D)M of the other domains in the same system are connected by different communication buses, for example, CAN buses, and may be able to communicate with each other. The management apparatus M can control each of the switching part 41 and the switch 43 in accordance with an instruction from the communication device 1.

The communication device 1 connected to the management apparatus (B)M of each bank has a function of causing the battery module group L to conduct predetermined charge or discharge upon acceptance of an instruction via the second communication part 13 and estimating a full-charge capacity from measured values of voltage and current measured during that time. In the example shown below, the communication device 1 charges or discharges the corresponding battery module group L between the state of charges 50% and 80% at a 1C rate and estimates the full-charge capacity from the measured values of the voltage and current in the process.

Figure 12:
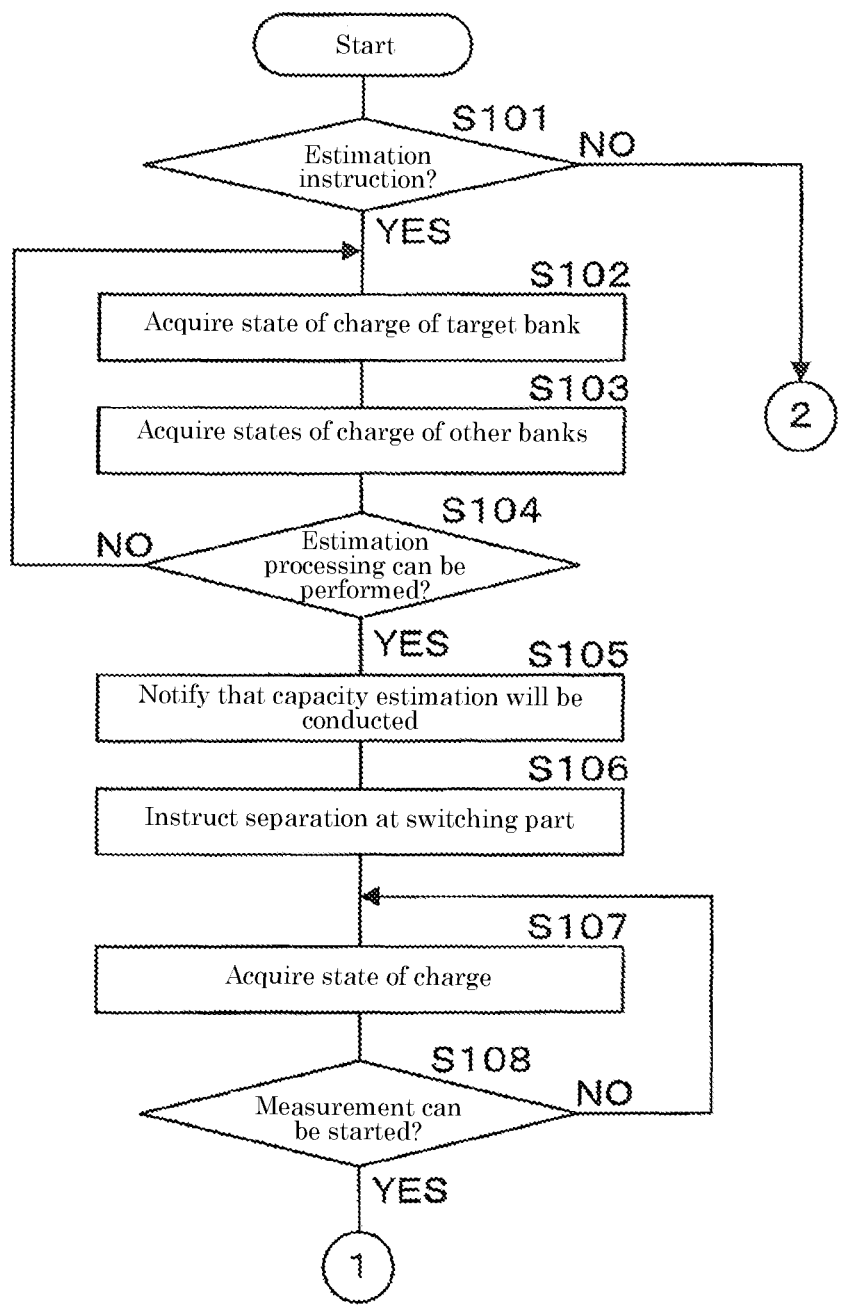
FIG. 12 is a flowchart showing an example of a processing procedure for estimating a full-charge capacity in the communication device.
Figure 13:
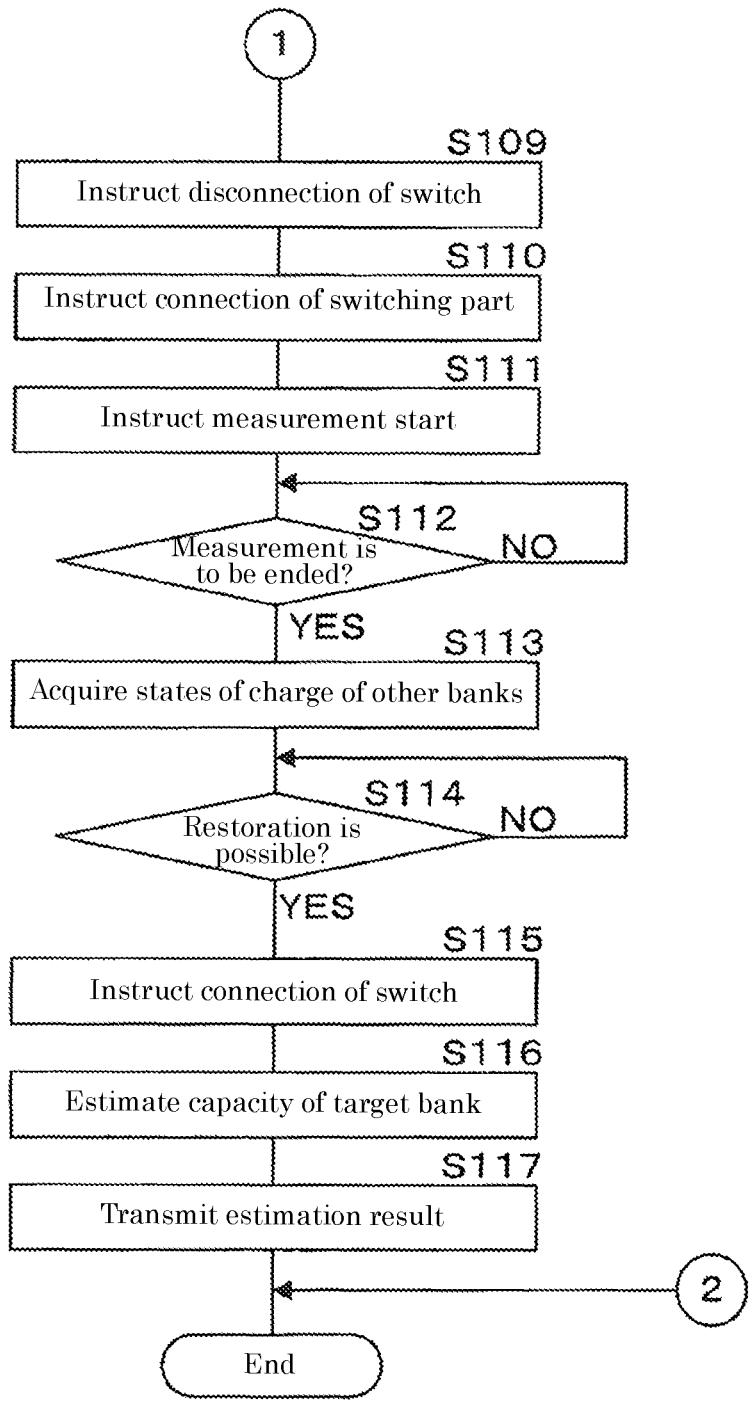
FIG. 13 is a flowchart showing an example of the processing procedure for estimating the full-charge capacity of the communication device.

FIGS. 12 and 13 are flowcharts showing an example of the processing procedure for the full-charge capacity estimation in the communication device 1.

The control part 10 of the communication device 1 uses the second communication part 13 to determine whether or not an instruction to estimate a full-charge capacity of a target bank has been received (step S101). The target bank is a bank corresponding to the management apparatus (B)M, which the communication device 1 is mounted on or connected to. The communication device 1 accepts an execution instruction for the estimation from the server apparatus 2, the client apparatus 3, or another communication device 1 via the second communication part 13. The processing in step S101 corresponds to the "acceptance part".

When it is determined that the estimation instruction has not been received (S101: NO), the control part 10 ends the processing.

When it is determined that the estimation instruction has been accepted (S101: YES), the control part 10 acquires, from the management apparatus M, the state of charge in the whole bank of the estimation target for the full-charge capacity (step S102). The control part 10 acquires the states of charge of other banks through communication with the other communication devices 1 (step S103).

The control part 10 determines whether or not the state is a state where the estimation processing for the full-charge capacity is possible on the basis of the state of charge in the target bank and the states of charge in the other bank (step S104). The control part 10 measures, for example, voltage and current in a process of charging from the state of charge 50% to 80% at the 1C rate or in a process of discharge from the state of charge 80% to 50%. The control part 10 determines that the estimation processing is possible when a charge rate is not more than a predetermined value (e.g., 50%) in the target bank and the other banks and the energy storage system 101 is being charged from the power generating system via the power conditioner P. The control part 10 may determine whether or not the time is included in a period of time (e.g., day or night) set in advance as an allowable range and may determine that the estimation processing is possible only when the time is included in the period of time which is the allowable range.

When it is determined in step S104 that the state is not suitable for the estimation processing (S104: NO), the control part 10 returns the processing to step S102 and waits until it is determined in step S104 that the state is suitable for the estimation processing.

That is, in the present embodiment, after the estimation instruction is accepted by the acceptance part, processing for estimating the full-charge capacity of the energy storage device is autonomously executed in the target bank.

When it is determined in step S104 that the state is suitable for the estimation processing (S104: YES), the control part 10 notifies the other communication devices 1 that the full-charge capacity estimation will be conducted on the target bank (step S105). In this case, the notification is preferably made to the other communication devices 1 or the server apparatus 2 in association with the information (bank identification number) that identifies the target bank for the capacity estimation. By notifying the server apparatus 2, it is possible to prevent the target bank for the capacity estimation from being erroneously detected as an abnormality, even when the bank shows a behavior different from those of the other banks arranged side by side.

The control part 10 instructs the corresponding management apparatus (B)M to separate the switching part 41 of the target bank or each of the other banks from the power line 42 (step S106). The processing in step S106 corresponds to the "instruction part". By separating the target bank, the charge of each of the other banks is continued. On the other hand, by separating the other banks, the charge of only the target bank is continued.

The control part 10 acquires the state of charge of the target bank or the states of charge of the other banks (step S107) and determines whether or not the measurement can be started on the basis of the acquired state of charge (step S108). In step S108, for example, the control part 10 determines whether or not the states of charge of the other banks are such that the separated target bank can be charged from 50% to 80%. Alternatively, the control part 10 determines whether or not the state of charge of the target bank has become 80%.

When it is determined in step S108 that the measurement cannot be started (S108: NO), the control part 10 returns the processing to step S107 after the lapse of a predetermined waiting time and waits until it is determined that the measurement can be started.

When it is determined in step S108 that measurement can be started (S108: YES), as shown in FIG. 13, the control part 10 instructs the management apparatus M of the domain to disconnect the switch 43 from the power conditioner P (step S109). When confirming that the switch 43 is disconnected, the control part 10 instructs the management apparatus (B)M of the target bank or the management apparatuses (B)M of the other banks to connect the switching part 41 (step S110), and instructs the management apparatus (B)M to start measuring voltage or current (step S111). The connection of the switch 43 and the switching part 41 may be controlled by communication between the communication devices 1, and the voltage and current may be measured while only the target bank is charged with electricity from the power generating system, or the voltage and current may be measured while only the target bank is discharged with electricity released to the power consumption equipment (load). Alternatively, when the measurement is to be performed in the process of charging the target bank from the state of charge 50% to 80% at the 1C rate, the switching part 41 of the target bank may be set to the connected state from the disconnected state. Thereby, a cross flow is generated from another bank to the target bank, and the target bank is charged. When the measurement is to be performed in the process of discharging the target bank from the charged state 80% to 50% at the 1C rate, the switching parts 41 of the other banks may be set to the connected state from the disconnected state. Thereby, a cross flow is generated from the target bank to another bank, and the target bank is discharged.

The control part 10 may change the sampling timing for the state acquisition in the management apparatus (B)M in accordance with the instruction for the measurement start in step S111 (the sampling timing may be shortened so that data can be acquired with higher frequency). The control part 10 preferably notifies the server apparatus 2 of the measurement start in association with the identification information of the target bank.

The control part 10 determines whether or not to end the measurement (step S112). In step S112, the control part 10 ends the measurement when it is determined that the state of charge in the energy storage module group L has reached, for example, from 50% (80%) at the start to 80% (50%), or when it is determined that a change in a predetermined voltage value or a change in a current value has been able to be measured. The control part 10 may determine whether or not to end the measurement on the basis of another condition. When it is determined that the measurement is not to be ended (S112: NO), the control part 10 returns the processing to step S112.

When it is determined that the measurement is to be ended (S112: YES), the control part 10 acquires the states of charge of the other banks through communication with the other communication devices 1 (step S113). On the basis of the acquired state of charge, the control part 10 determines whether or not the switch 43 between all the banks and the power conditioner P can be restored to the normal state (step S114). In step S114, the control part 10 determines that the electric connection is not possible when the state of charge is not balanced with the other banks. When it is determined that it is not possible (S114: NO), the control part 10 returns the processing to step S114 after the predetermined waiting time.

When it is determined that the restoration is possible (S114: YES), the control part 10 instructs to connect the switch 43 (step S115). Thereafter, all the banks of the domain are operated in the electrically connected state.

The control part 10 estimates the full-charge capacity of the whole target bank on the basis of the voltage value and current value measured during steps S111 to S112, or one of the measured voltage value and current value (step S116). In step S116, the control part 10 estimates the full-charge capacity on the basis of a change in voltage during the charge of the energy storage module group L and an integrated current value. The control part 10 transmits the estimation result to the server apparatus 2 from the second communication part 13 in association with the time information and the bank identification information (step S117) and ends the processing. The processing in step S117 corresponds to the "transmission processing part". The control part 10 may omit the estimation processing in step S116 and transmit the measured voltage value and current value to the server apparatus 2.

In step S111, the control part 10 can turn off a function of a balancer circuit included in each of the energy storage modules and measure a change in voltage during a predetermined period, thereby determining degradation and estimating the full-charge capacity.

As described above, by performing the processing procedure shown in the flowcharts of FIGS. 12 and 13, the communication device 1 can perform the estimation processing for the full-charge capacity (capacity check) of a specific bank in the energy storage module group L by using the instruction as a trigger. The communication device 1 receives, as a trigger, an instruction from the communication device 1 of another bank in parallel, the communication device 1 of the domain, or the server apparatus 2 and autonomously estimates a capacity in a bank unit. The trigger may be output by the communication device 1 itself. Instructions received by the communication device 1 in a bank unit includes an instruction received on the basis of an operation on the interface presented by the communication device 1 itself (first instruction), and instructions received on the basis of an operation on the Web screen 330 presented by the server apparatus 2 (second instruction). The instructions include an instruction that is output when the server apparatus 2 autonomously determines that the capacity estimation processing is necessary (third instruction). The communication device 1 itself may autonomously detect an abnormality and determine that capacity estimation is necessary.

In this manner, by using the communication device 1, it is possible to remotely estimate the full-charge capacity of the energy storage device included in the connected/mounted target apparatus (energy storage module group L).

The first instruction will be described with reference to an example of the interface presented from the communication device 1. The interface presented from the communication device 1 can be accessed from link information included in the portal page of the remote monitoring system 100, provided from the server apparatus 2. The client apparatus 3 may directly store information of connection to the interface into the storage part 31 and use the connection information.

Figure 14:
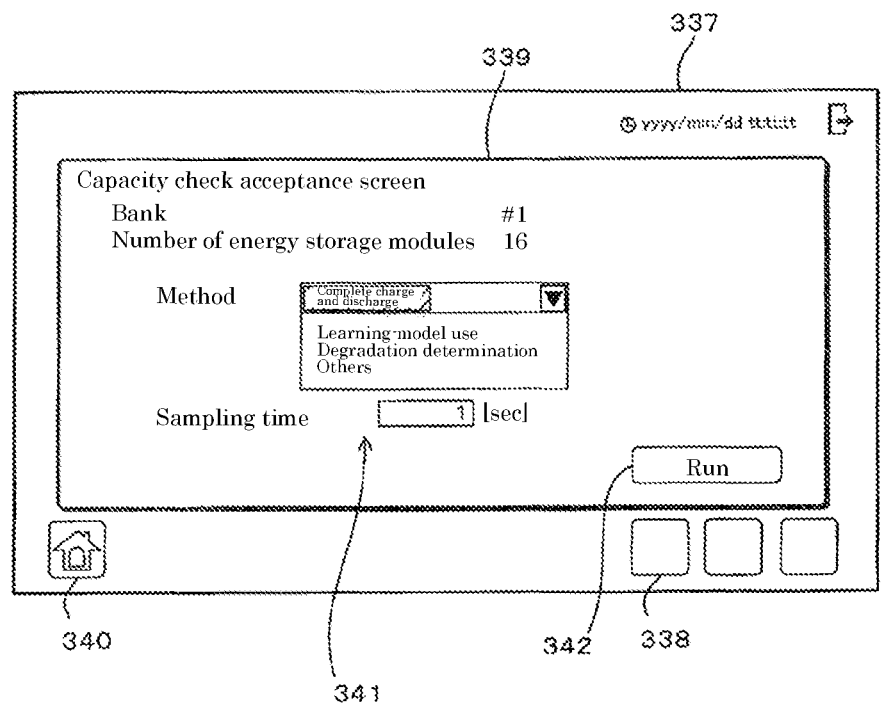
FIG. 14 is a view showing an example of the screen presented by the communication device.

FIG. 14 is a view showing another example of the Web screen 337 presented from the communication device 1. FIG. 14 is an example of a screen that is displayed when an icon for estimating the full-charge capacity is selected from the menu icons 338 in FIG. 8. The client apparatus 3 capable of displaying the screen example shown in FIG. 14 may be limited to the client apparatus 3 in which a user (operator) assigned with administrator authority has logged in. As shown in FIG. 14, when the menu icon 338 is selected, the screen 339 superimposed on the Web screen 337 is displayed, and the icon 340 for returning to the Web screen 337 of FIG. 8 is displayed.

The screen 339 includes an execution acceptance screen 341 configured to execute the estimation of the full-charge capacity in the energy storage module group L of the bank to which the communication device 1 of the presentation source of the Web screen 337 is connected. In the example of the execution acceptance screen 341 shown in FIG. 14, a selection field for accepting the selection of a method for the capacity estimation and a setting input field for a sampling time (interval) of a measured value for the capacity estimation are included. On the execution acceptance screen 341, when a run button 342 is selected by the operation part 34 of the client apparatus 3 after the method selection or the input is appropriately performed, an estimation instruction for the capacity is accepted (S101). When the estimation becomes possible (S104: YES), the measurement is then started after the target bank is separated (S111), and the capacity estimation processing is performed (S116). As described above, it is possible to remotely and manually accept the capacity estimation processing of the energy storage module group L via the Web screen 337 presented by the communication device 1.

Figure 15:
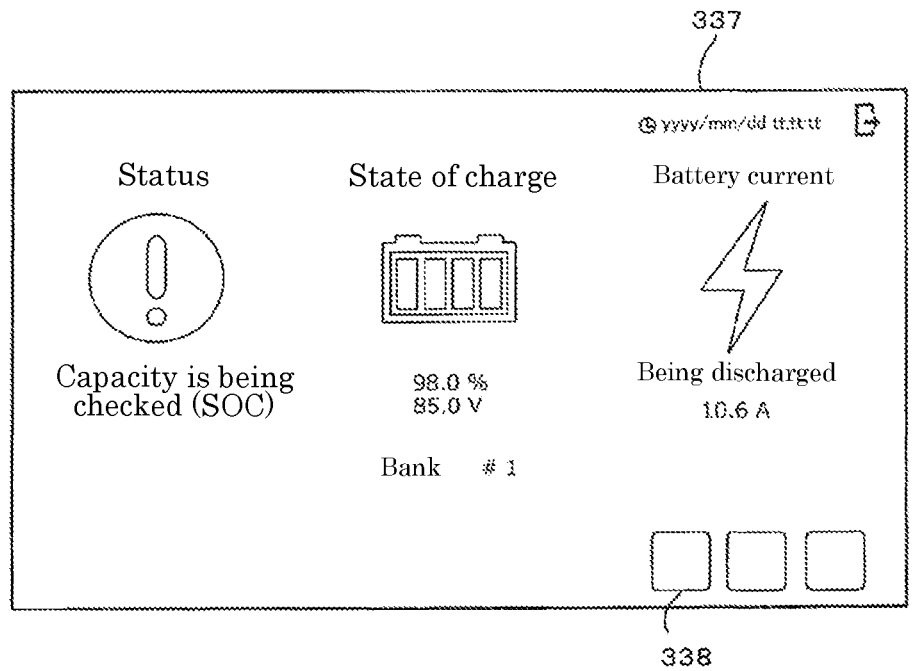
FIG. 15 is a view showing an example of the screen presented by the communication device.

FIG. 15 is a view showing another display example of detailed information. FIG. 15 shows an example of a screen displayed during the estimation processing. Similarly to FIG. 8, the Web screen 337 includes, as "bank information", the state of the bank, the total voltage of the bank, the current, the cell voltage, the SOC, and the temperature distribution (maximum, mean, and minimum values). However, in FIG. 15, a message indicating that "the capacity is being checked" as the state of the bank, is included.

During the estimation processing for the full-charge capacity (capacity check), the client apparatus 3 can sequentially grasp the state via the communication device 1. The server apparatus 2 can also recognize that the estimation processing for the full-charge capacity is being performed on the corresponding bank. On the Web screen 330 shown in FIG. 7, the server apparatus 2 may output, in color or light, the fact that the capacity is being checked by using the icon 333 of the corresponding bank or by the icon 335 for displaying details.

Figure 16:
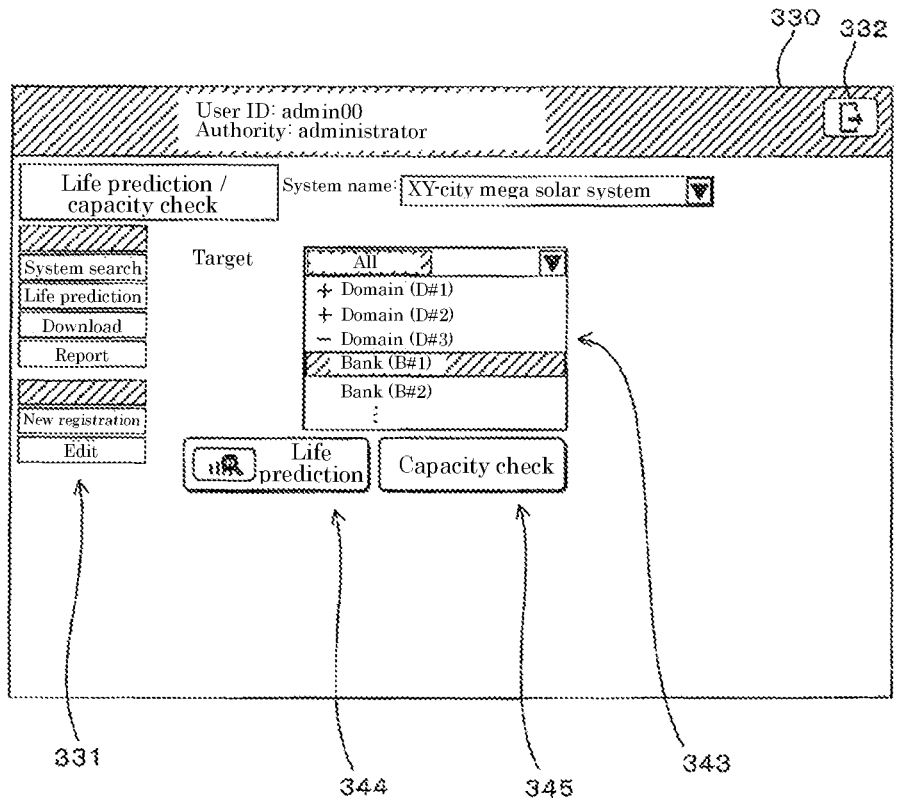
FIG. 16 is a view showing an example of the screen provided by the server apparatus.

The second instruction will be described with reference to a Web screen provided by the server apparatus 2. FIG. 16 is a view showing an example of the screen provided by the server apparatus 2. FIG. 16 is a screen that is displayed when the menu icon 338 "life prediction" in FIG. 7 is selected. The screen 330 of FIG. 16 includes a target selection field 343, an icon 344 for accepting a request for life prediction, and an icon 345 for accepting an instruction for capacity check, that is, capacity estimation processing. When the icon 345 for accepting an instruction for the capacity estimation processing is selected, the control part 20 of the server apparatus 2 recognizes a domain or a bank being selected in the selection field 343 and transmits an estimation instruction to the communication device 1 mounted on/connected to the recognized domain or bank. As shown in FIG. 16, the selection field 343 accepts a selection as to whether to check the capacity for each bank, to collectively check the capacity for a domain including a plurality of banks, or to collectively check the capacity for the whole domain.

For example, when a domain is selected in the selection field 343, the control part 20 of the server apparatus 2 transmits an estimation instruction to the communication device 1 mounted on/connected to the selected domain. The control part 10 of the communication device 1 mounted on/connected to the domain sequentially selects one or more (e.g., two or three) banks belonging to the domain. The communication device 1 of the domain transmits an estimation instruction to the communication device 1 mounted on/connected to the selected bank by communication between the communication devices 1. Alternatively, the control part 20 may sequentially select one or more banks belonging to the domain and transmit an estimation instruction to the communication device 1 mounted on/connected to the selected bank. Thereafter, the same processing as that shown in the flowcharts of FIGS. 12 and 13 is performed. "Also, when the icon 344 for accepting a request for life prediction is selected, the capacity estimation processing may be performed.

When "WHOLE" is selected in the selection field 343, the control part 20 of the server apparatus 2 checks the capacity in a predetermined unit such as a bank, while continuing the operation, on the basis of the state of the whole system. For example, the control part 20 selects the domains or the banks included in the target system one by one and transmits an estimation instruction. When the estimation processing for the full-charge capacity of the selected domain or bank is completed on the basis of the estimation instruction and it is confirmed that the selected domain or bank is electrically connected to the energy storage system 101 and restored, the control part 20 selects the next domain or bank and transmits an estimation instruction. The subsequent processing is the same as in the case of the domain selection described above.

In addition to that the capacity estimation processing is manually started on the reception screen shown in FIG. 16, a setting may be made on the basis of a schedule set in the server apparatus 2. The server apparatus 2 outputs a setting screen for the date and time provided in the screen of FIG. 16 and stores the set date and time into the storage part 21 for the selected target energy storage system 101 or the energy storage module group L in a domain or bank unit. The control part 20 of the server apparatus 2 transmits an estimation instruction to the corresponding communication device 1 when detecting that the stored set date and time have been reached.

Figure 17:
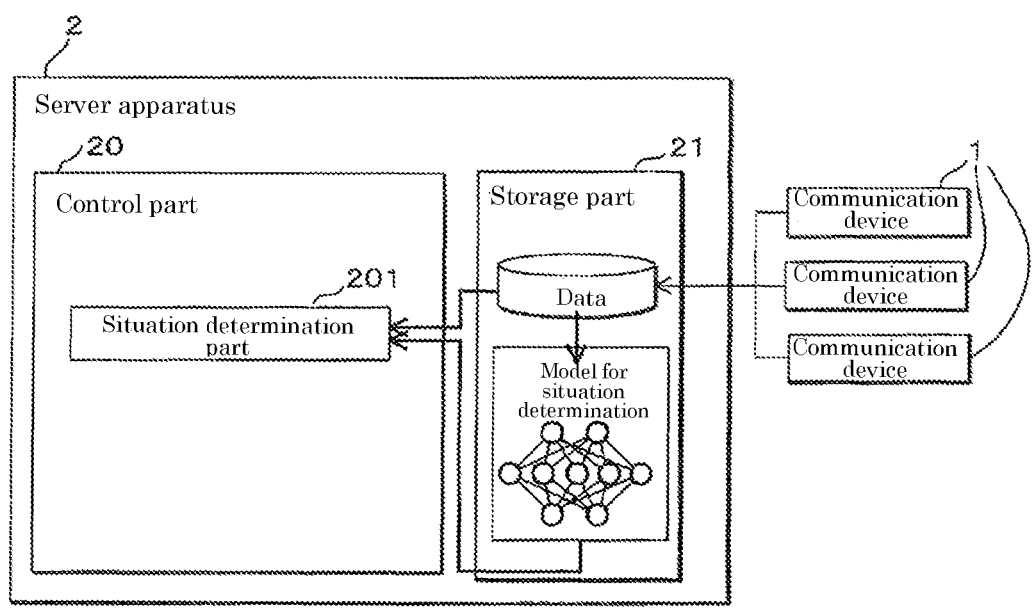
FIG. 17 is a functional block diagram of the server apparatus.

The third instruction will be described. In the remote monitoring system 100, the control part 20 of the server apparatus 2 collects the state of the whole system for each system. The control part 20 may autonomously determine whether or not the capacity estimation processing is necessary by using the collected information, and when determining that it is necessary, the control part 20 may transmit an estimation instruction to the communication device 1 corresponding to the target domain or bank. The control part 20 may estimate the full-charge capacity on the basis of the collected state. FIG. 17 is a functional block diagram of the server apparatus 2. The control part 20 functions as a situation determination part 201.

On the basis of the information (data) collected via the communication device 1, the situation determination part 201 determines whether or not the situation is where the capacity needs to be checked in the system or the unit of the energy storage module group L. For example, the situation determination part 201 determines that the capacity of the target system or the specific energy storage module group L will be checked when a sign of abnormality of the system or the energy storage module group L is detected. The sign detection may be performed by statistical analysis based on the information in the server apparatus 2 or threshold determination. As illustrated in the figure, the sign detection may be performed on the basis of artificial intelligent situation determination by learning about degradation or abnormality prediction based on each acquired state information. The artificial intelligent situation determination is, for example, deep learning in which state information is used as an input hierarchy, and the state is output as a determination result. Other determinations may be performed by regression analysis on the state information.

Figure 18:
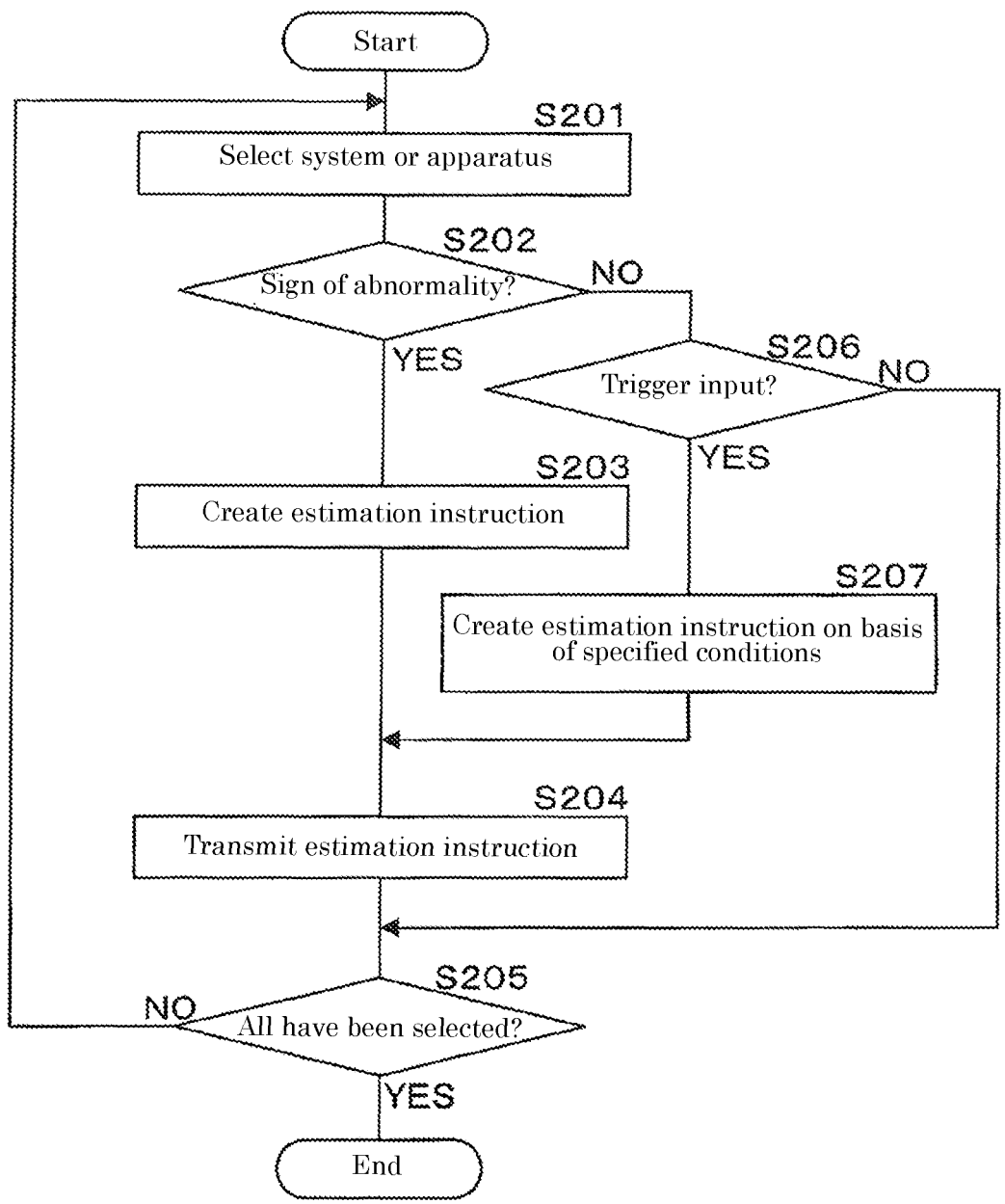
FIG. 18 is a flowchart showing an example of a processing procedure according to an instruction from a control part of the server apparatus.

FIG. 18 is a flowchart showing an example of a processing procedure according to an instruction from the control part 20 of the server apparatus 2. The control part 20 of the server apparatus 2 periodically (e.g., once an hour, a day, etc.) performs the following processing procedure. The server apparatus 2 may perform the following processing procedure by using the reception of data from the communication device 1 as a trigger. In a case where a sign one month ahead is detected by one-time calculation, the calculated sign may be corrected in a one-day cycle. That is, the state prediction at a future second time point may be corrected at a first time point that is the future closer to the present than the second time point.

The control part 20 selects one system or apparatus to be monitored (step S201). In step S201, the control part 20 selects one piece of the identification information of the system or apparatus to be monitored, the information being stored in advance in the storage part 21. For the selected system or apparatus, the control part 20 determines whether or not a sign of abnormality has been detected on the basis of the collected state information by the function of the situation determination part 201 (step S202).

When it is determined that a sign of abnormality has been detected (S202: YES), the control part 20 creates an estimation instruction specifying the system or apparatus selected as the estimation target for the full-charge capacity (step S203). The control part 20 transmits the created estimation instruction to the communication device 1 corresponding to the selected system or apparatus (step S204). In step S203, the control part 20 may include, in the instruction information, an instruction to change the setting of the sampling timing for the state acquisition to a higher frequency for the target system, domain, or bank.

The control part 20 determines whether or not selections have been made for all the systems or apparatuses (step S205), and the control part 20 returns the processing to step S201 when determining that the selections have not been made (S205: NO), and ends the processing when determining that the selections have been made (S205: YES).

In response to the estimation instruction transmitted from the server apparatus 2, the communication device 1 of the corresponding bank performs the processing procedure shown in the flowchart of FIG. 13 to estimate the full-charge capacity. The estimation instruction may be transmitted via the communication device 1 of the domain.

When it is not determined that a sign of abnormality has been detected (S202: NO), the control part 20 determines whether or not a trigger input for the estimation instruction for the full-charge capacity has been made (step S206). For example, the trigger may be output by the control part 20 itself on the basis of a schedule stored in advance in the storage part 21 in association with the selected system or apparatus or may be output in accordance with an instruction from the client apparatus 3 by using the icon 340 included in the Web screen 330 of FIG. 16.

When it is determined in step S206 that a trigger input has been made (S206: YES), the control part 20 creates an estimation instruction on the basis of conditions (target and time) specified in correspondence with the trigger input (step S207) and transmits the estimation instruction (S204).

When it is determined in step S206 that no trigger input has been made (S206: NO), the control part 20 advances the processing to step S205.

Any of a plurality of communication devices 1 mounted on/connected to the energy storage system 101 having a hierarchical structure can perform the processing procedure shown in the flowchart of FIG. 12 on the basis of the device program 1P. Thus, the transmission of the estimation instruction from the server apparatus 2 or the client apparatus 3 to each communication device 1 is controlled, so that it is possible to remotely perform the full-charge capacity estimation (capacity check) in accordance with the situation. Conventionally, the capacity check has been conducted by a person in charge of maintenance, performing work to cut the target energy storage device from the energy storage system 101 and performing measurement processing at the installation place of the energy storage system 101. With the use of a single or more communication devices 1 described above, the full-charge capacity can be estimated by various methods including complete charge and discharge, so that the work of the person in charge of maintenance can be greatly reduced.

(Modification 1)

Figure 19:
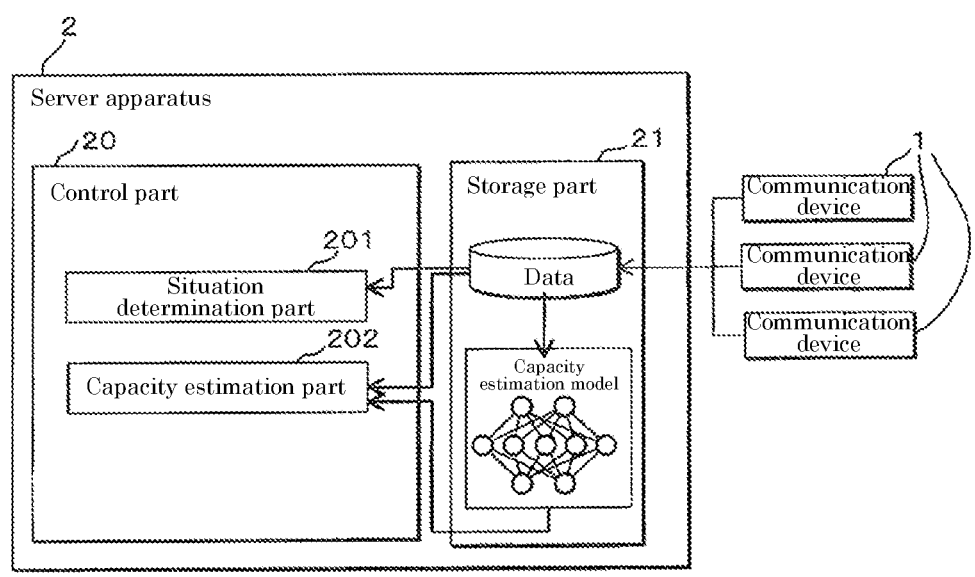
FIG. 19 is a functional block diagram of a server apparatus according to Modification 1.

In Modification 1, the communication device 1 only acquires measurement data of current or voltage. The communication device 1 transmits the measurement result obtained from the management apparatus (B)M to the server apparatus 2, and in Modification 1, the server apparatus 2 performs the estimation processing for the full-charge capacity. FIG. 19 is a functional block diagram of the server apparatus 2 in Modification 1. The control part 20 functions as the situation determination part 201 and a capacity estimation part 202.

The capacity estimation part 202 performs processing of estimating the full-charge capacity by using the collected information and the information measured by a measurement part 70 for the target energy storage module group L in response to the estimation instruction. The capacity estimation part 202 in the modification is not limited to using voltage and current under a predetermined discharge control (e.g., 80% to 50%) but preferably estimates the capacity by inputting collected and measured information through learning processing such as machine learning and deep learning or statistical processing such as regression analysis. Measured values of voltage and current in the case of complete charge and discharge (100% to 0%) or predetermined charge control are previously input and a capacity estimation model obtained by learning with a full-charge capacity used as teacher data may be stored in advance in the storage part 21 so as to be illustrated, and by using the capacity estimation model, the control part 20 may input the measured values to estimate the capacity. The capacity may be estimated not only by processing based on learning with a teacher but also by machine learning without a teacher.

Figure 20:
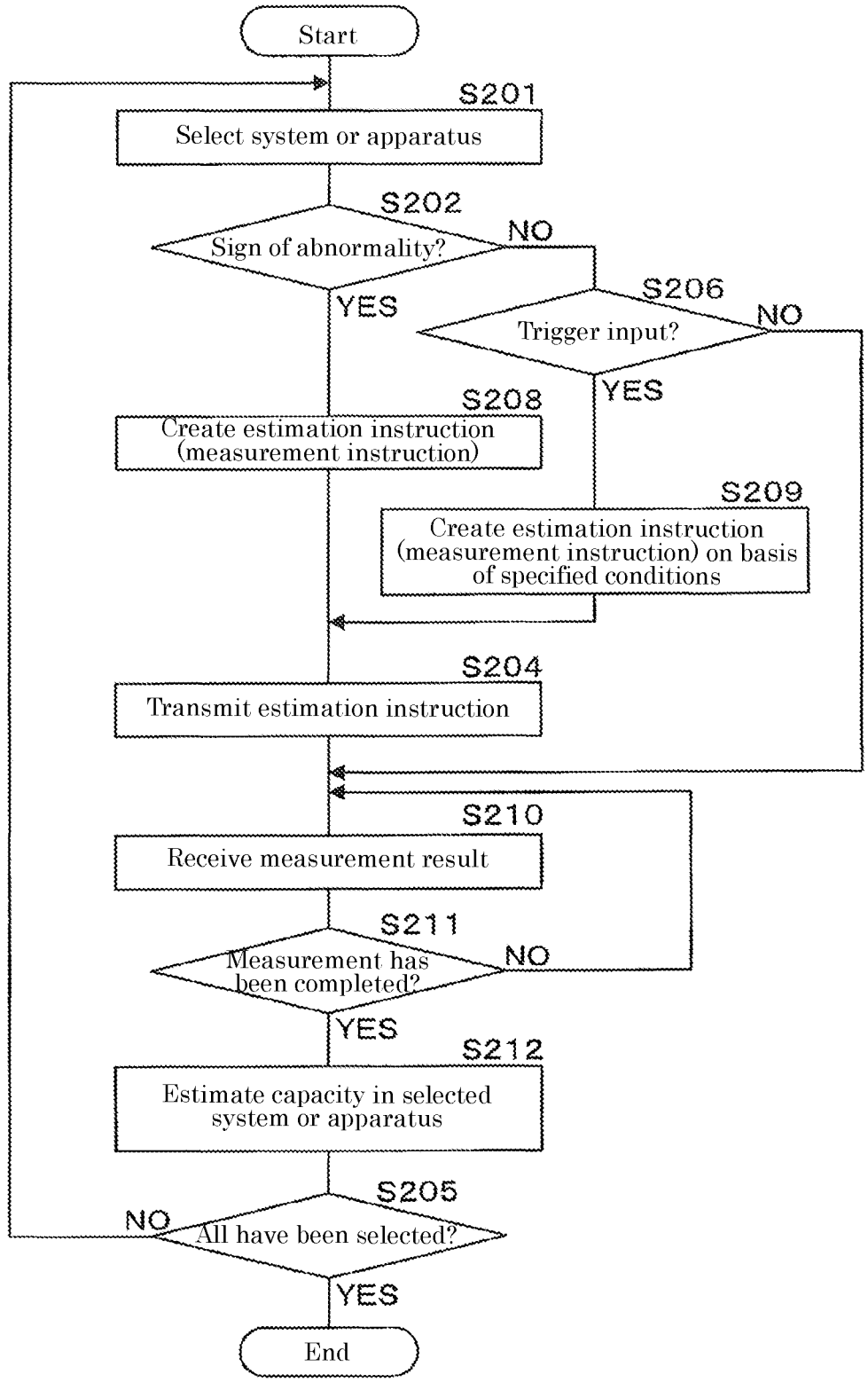
FIG. 20 is a flowchart showing an example of a processing procedure for estimation of a full-charge capacity by a control part of the server apparatus in Modification 1.

FIG. 20 is a flowchart showing an example of the processing procedure for estimating the full-charge capacity by the control part 20 of the server apparatus 2 in Modification 1. In the processing procedures of the flowchart of FIG. 20, the procedures common to the flowchart of FIG. 18 are denoted by the same step numbers, and a detailed description thereof will be omitted.

When it is determined in step S202 that a sign of abnormality has been detected (S202: YES), the control part 20 specifies a system or apparatus selected as a target for estimating the full-charge capacity and creates an estimation instruction including a measurement instruction (step S208). The control part 20 transmits the estimation instruction created in step S208 to the communication device 1 (S204). In this case, in the communication device 1, step S111 in the processing procedure in the flowcharts of FIGS. 12 and 13 is omitted, and the measurement result, not the estimation result, is transmitted (S112).

The control part 20 receives the measurement result transmitted in response to the transmitted estimation instruction including the measurement instruction (step S210) and determines whether or not the measurement has been completed (step S211). In the example shown in the flowchart of FIG. 12, the communication device 1 transmits the measurement result after the measurement is completed, and hence the completion is preferably confirmed by receiving the measurement result. In a case where the measurement results are sequentially transmitted, the control part 20 may determine that the processing has been completed when completion notification is transmitted from the communication device 1. When it is determined that the measurement has not been completed (S211: NO), the control part 20 returns the processing to step S210.

When it is determined that the measurement has been completed (S211: YES), the control part 20 estimates the capacity of the energy storage device in the system or apparatus selected in step S201 on the basis of the measurement result and the information collected so far by using the capacity estimation part 202 (step S212). When the system is the whole domain, the processing of each of steps S210 and S211 may be sequentially executed for each bank included in the domain.

After the capacity estimation processing is completed (S212), the control part 20 advances the processing to step S205.

As shown in Modification 1, even when the person in charge of maintenance has not visually recognized the situation of the energy storage system 101 on the Web screen 330, the full-charge capacity can be estimated autonomously when a sign of abnormality can be detected. It is also possible to autonomously identify the degraded energy storage module. Prior to transition to an abnormal state, the degraded energy storage module can be replaced. It is possible to cope with unexpected circumstances before the circumstances occur, while reducing a burden on the person in charge of maintenance, and to achieve reliable and stable continuous operation of the energy storage system 101.

(Modification 2)

Figure 21:
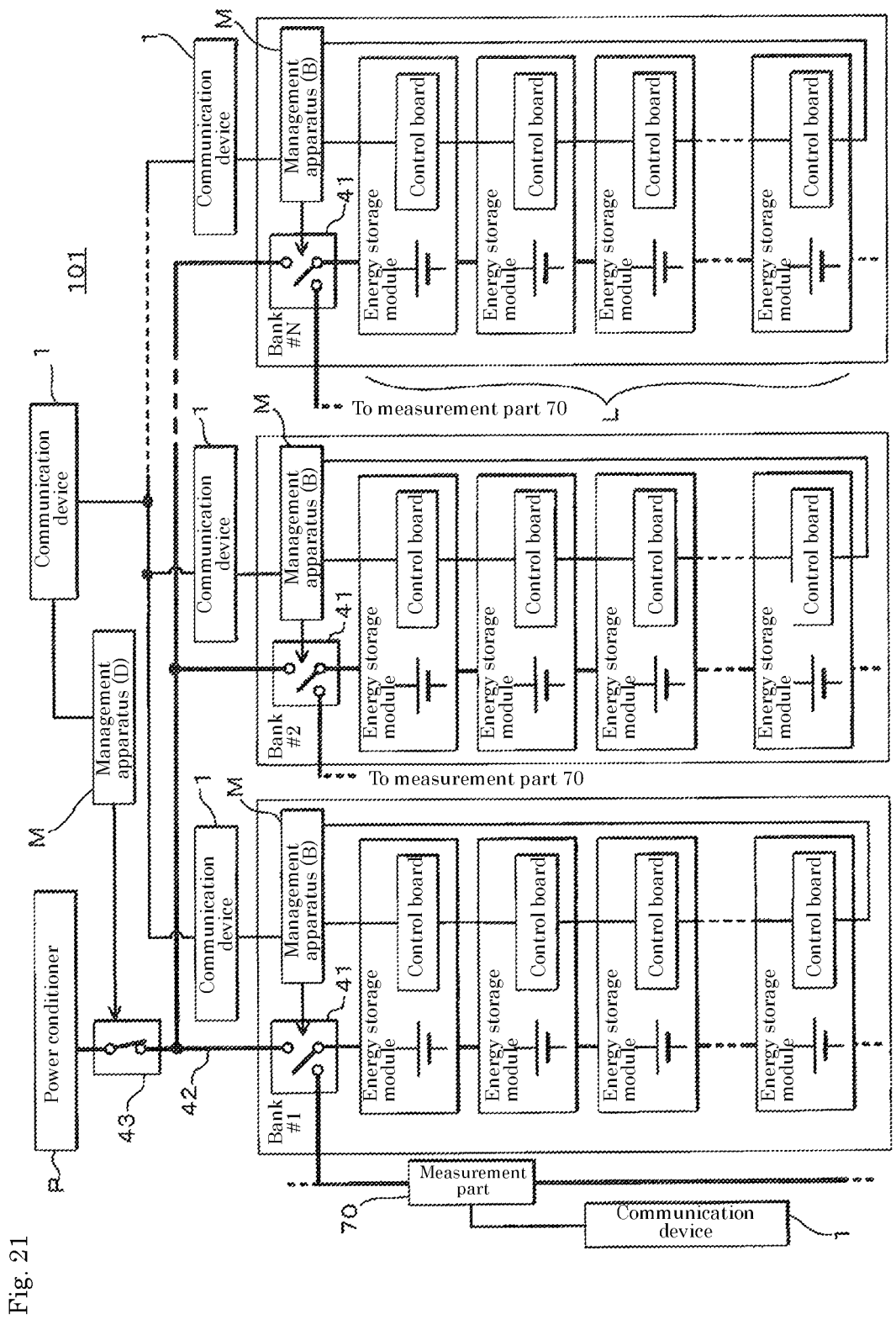
FIG. 21 is a block diagram showing a configuration example of an energy storage system in Modification 2.
Figure 22:
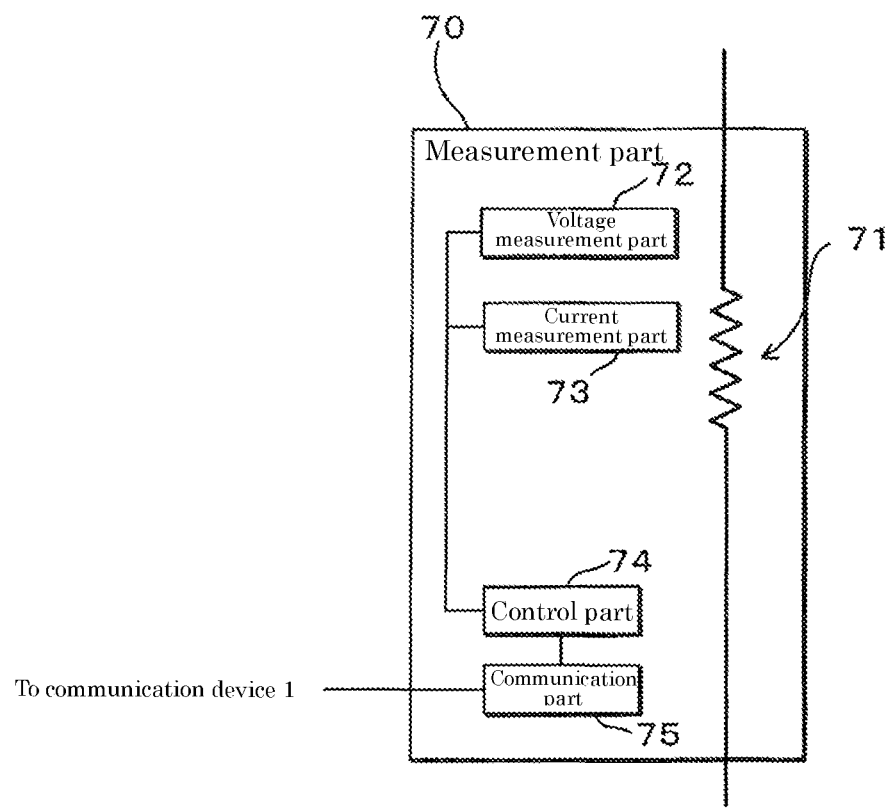
FIG. 22 is a block diagram of a measurement part.

In the embodiment and Modification 1 described above, the description has been made giving the example where the capacity is estimated by measuring voltage and current during the charge and discharge of the target bank in a predetermined period of time. In addition, a load for measurement may be provided separately. FIG. 21 is a block diagram showing a configuration example of the energy storage system 101 in Modification 2. In the modification, the measurement part 70 is provided in parallel with the energy storage module group L. The measurement part 70 is equipment for measuring the capacity (SOH) of the energy storage module group L. The measurement part 70 is connected to the communication device 1 by a communication line. FIG. 22 is a block diagram of the measurement part 70. The measurement part 70 includes a voltage drop device 71, a voltage measurement part 72, a current measurement part 73, a control part 74, and a communication part 75. The measurement part 70 may be controlled integrally with the switching part 41. The voltage drop device 71 is a resistor provided in parallel with the energy storage module group L. The voltage measurement part 72 measures a potential difference in the voltage drop device 71 and notifies the control part 74 of the potential difference. The current measurement part 73 measures current in the voltage drop device 71 and notifies the control part 74 of the current. The control part 74 stores the measured values measured by the voltage measurement part 72 and the current measurement part 73 into a built-in storage part.

Upon acceptance of a signal from the outside or an instruction for measurement via the communication part 75, the control part 74 estimates the full-charge capacity on the basis of the change in voltage during the discharge of the energy storage module group L or the integrated current value during the discharge. The estimation is performed by a complete charge-discharge method in which discharge is performed from full charge to a charge rate of 0%, and the change is measured during the discharge. The estimation is not limited to the complete charge-discharge method but may be performed on the basis of a change in voltage or current up to a predetermined ratio.

The communication part 75 of the measurement part 70 achieves transmission and reception of information to and from the communication device 1. The control part 74 notifies the communication device 1 of the information (voltage and current) obtained by the measurement or the full-charge capacity of the estimation result from the communication part 75. The communication device 1 connected to the measurement part 70 can be communicatively connected to the other communication devices 1. The communication device 1 can instruct the measurement part 70 to perform the measurement start or measurement end by the measurement part 70 on the basis of the information transmitted and received to and from the other communication devices 1 and can receive the notification of the measurement result from the measurement part 70.

In the example of FIG. 21, the switching part 41 switches the on/off of power supply to the energy storage module group L from the branch point of the power line 42 to the plurality of banks and the connection to the measurement part 70. The switching part 41 switches among a state in which the power line 42 and the energy storage module group L are connected, a state in which the energy storage module group L and the measurement part 70 are connected, or an off-state in which neither connection is made. One measurement part 70 is provided for the domain outside the bank, and the capacity is estimated by switching the energy storage module group L of each bank by the switching part 41. The measurement part 70 may be provided in each bank.

In Modification 2, the control part 10 of the communication device 1 performs the processing procedure shown in the flowcharts of FIGS. 12 and 13. In Modification 2, the measurement part 70 is used to perform complete discharge (e.g., from full charge to 0 (zero) % at the 1C rate, and a high rate may be used) from the energy storage module group L, and the full-charge capacity is estimated on the basis of the measured value obtained by measurement during the discharge. The separation by the switching part 41 in step S106 is replaced by control for connecting the switching part 41 of the target bank to the measurement part 70, instead of turning off the switching part 41 of the bank except for the target bank. Then, in step S114, the control part 10 determines whether or not the state is where it is estimated that the capacities of the other banks have decreased and an excessive cross flow will not be generated even when the completely discharged target bank is connected.

In Modification 2, the measurement part 70 only performs measurement, and the estimation processing for the full-charge capacity may be performed by the communication device 1 or the server apparatus 2.

As described above, the capacity estimation system of the present embodiment includes: an information processing apparatus that processes information including a state of an energy storage device; a management apparatus that acquires voltage and current in the energy storage device; and a communication device including a first communication part that communicates with the management apparatus and a second communication part that communicates with the information processing apparatus or another apparatus. The communication device includes an acceptance part that accepts an estimation instruction for a full-charge capacity of the energy storage device by using the second communication part, and a transmission processing part that, when the acceptance part accepts the estimation instruction, transmits the voltage and current acquired from the management apparatus by using the first communication part and/or transmits a state of charge estimated on the basis of the voltage and current by using the second communication part.

With the above configuration, it is possible to remotely check the full-charge capacity of the energy storage device and to greatly reduce a burden on the person in charge of maintenance. By providing the second communication part that transmits information acquired by the first communication part to the outside, it is also possible to cope with the maintenance of the large-scale energy storage system.

The estimation processing for the full-charge capacity based on the voltage and current acquired from the management apparatus may be performed by the communication device or may be performed by the information processing apparatus on the basis of the information transmitted from the communication device.

The energy storage device may include a plurality of banks connected in parallel, and the second communication part may transmit, to the information processing apparatus or another apparatus, identification information of a bank in which a full-charge capacity is being estimated and/or identification information of a domain including the bank.

With the above configuration, it is possible to grasp which energy storage device in a large-scale energy storage system or in a maintenance target area including a plurality of systems and a plurality of places is in the processing of estimating the full-charge capacity. Even when the energy storage device shows a behavior different from those of the other energy storage devices provided in parallel, it is possible to prevent erroneous determination of the behavior as abnormal.

Each of the plurality of banks may include a switching part that switches connection or disconnection with a power line for electric connection to the energy storage device, and the management apparatus may be provided for each of the plurality of banks and control the switching part.

With the above configuration, in a large-scale energy storage system having a plurality of banks, it is possible to estimate the full-charge capacity for each bank.

The communication device may be provided so as to be communicable with each of the plurality of banks and may instruct disconnection or connection in the switching part of a bank connected via the first communication part or in the switching part of another bank via another communication device.

In the capacity estimation system, a selection may be made as to whether the full-charge capacity is collectively estimated for a plurality of banks or the full-charge capacity is estimated for a specific bank in a plurality of banks.

A measurement part including a voltage drop device may be provided, and for the discharge from the energy storage device, electricity may be released to the voltage drop device. In this case, voltage and current may be measured during a rapid (high-rate) complete discharge.

The capacity estimation method uses: an information processing apparatus that processes information including a state of an energy storage device; a management apparatus that acquires voltage and current in the energy storage device; and a communication device including a first communication part that communicates with the management apparatus and a second communication part that communicates with the information processing apparatus or another apparatus. The communication device accepts an estimation instruction for a full-charge capacity of the energy storage device by using the second communication part, and when accepting the estimation instruction, the communication device transmits the voltage and current acquired from the management apparatus by using the first communication part and/or transmits a state of charge estimated on the basis of the voltage and current by using the second communication part.

The energy storage system includes: an energy storage device unit hierarchically including a plurality of energy storage devices; a management apparatus that acquires voltage and current in each of the plurality of energy storage devices for each energy storage device; and a power conditioner connected to the energy storage device unit via a power line. The energy storage system includes: a switching part that is interposed in the power line and switches the connection or disconnection of the power line; a communication part that acquires the voltage or current in the energy storage device unit for each energy storage device from the management apparatus and transmits the voltage or current to another apparatus; and a communication device connected to or mounted on the energy storage device unit. The communication device includes an acceptance part that accepts an estimation instruction for a full-charge capacity of the energy storage device unit or the plurality of energy storage devices by using the communication part, and a transmission processing part that, when the acceptance part accepts the estimation instruction, controls the switching part so as to transmit voltage and current acquired from the management apparatus or transmit a full-charge capacity estimated on the basis of the voltage and current, to the another apparatus.

The communication device includes: a first communication part that is connected to an energy storage device and acquires information of voltage and/or current in the energy storage device; a second communication part that communicates with another apparatus; an acceptance part that accepts an estimation instruction for a full-charge capacity of the energy storage device through communication in the second communication part; and a processing part that, when the acceptance part accepts the estimation instruction, controls a switching part configured to switch connection or disconnection of a power line for electric connection to the energy storage device so as to start measurement of the voltage and the current in the energy storage device.

The computer program causes a computer provided with a display part to receive and display information of an energy storage device. The computer program causes the computer to perform the steps of; requesting display information that displays a state of the energy storage device; displaying the state of the energy storage device on the basis of display information transmitted in response to the request; communicatively connecting to a communication device on the basis of information of connection to the communication device connected to the energy storage device included in the display information; and displaying a screen that accepts execution of estimation of a full-charge capacity of the energy storage device provided from the communication device.

The embodiments disclosed above are illustrative in all respects and are not restrictive. The scope of the present invention is defined by the claims and is intended to include meanings equivalent to the claims and all modifications within the claims.

The invention claimed is:

1. A communication device comprising:
   a first communication part that is connected to an energy storage device or a power supply related apparatus and communicates with the energy storage device or the power supply related apparatus;
   an acquisition part that acquires information including a state of the energy storage device or the power supply related apparatus on a basis of a set timing;
   a change acceptance part that accepts a change in the timing and changes the timing; and
   a transmission part that transmits, at a timing after the change, the information acquired by the acquisition part to a first apparatus by using a second communication part communicatively connected to the first apparatus.

2. The communication device according to claim 1, wherein the change acceptance part transmits, to a second apparatus provided with a display part, screen information serving to display a screen that accepts a change in the timing by using the second communication part, the change acceptance part accepting the change in the timing on the screen displayed by the display part provided in the second apparatus.

3. The communication device according to claim 1, wherein the change acceptance part receives, by using the second communication part, an instruction to change the timing transmitted from the first apparatus.

4. The communication device according to claim 1, wherein the change acceptance part accepts the change in the timing of acquiring the information including the state of the energy storage device or the power supply related apparatus.

5. The communication device according to claim 1, wherein the change in the timing of the acquiring the information comprises changing a sampling time for the acquisition of the state of the energy storage device or the power supply related apparatus.

6. The communication device according to claim 1, wherein the energy storage device includes a hierarchical structure, and
   wherein the change in the timing of the acquiring of the information is remotely changed via a server.

7. An information processing system comprising:
   a communication device connected to an energy storage device or a power supply related apparatus; and
   an information processing apparatus that transmits and receives information to and from the communication device, wherein
   the communication device includes:
      an acquisition part that acquires information including a state of the energy storage device or the power supply related apparatus on a basis of a set timing;
      a change acceptance part that accepts a change in the timing and changes the timing; and
      a transmission part that transmits, at a timing after the change, the information acquired by the acquisition part to the information processing apparatus, and
   the information processing apparatus includes:
      a determination part that determines whether the timing needs to be changed; and
      an instruction part that transmits to the communication device an instruction to change the timing when the determination part determines that the change is necessary.

8. The information processing system according to claim 7, wherein
   the determination part determines whether frequency of information acquisition needs to be increased on a basis of learning processing on degradation or detection of a sign of abnormality of the energy storage device or the power supply related apparatus based on information transmitted from the communication device, and
   when it is determined that the frequency needs to be increased, the instruction part determines the timing after the change and creates an instruction for the change.

9. The information processing system according to claim 7, wherein
   the information processing apparatus includes a transmission processing part that transmits display information to a request source of information, the display information serving to collectively display information including a state of the energy storage device and/or the power supply related apparatus for each of systems including the energy storage device and/or the power supply related apparatus or for each of places where the energy storage device and/or the power supply related apparatus are installed, and
   the display information includes information of connection to the communication device that provides screen information serving to display a screen that accepts a change in the timing.

10. The communication system according to claim 7, wherein the determination part determines to change a frequency of information acquisition on a basis of learning processing on degradation or detection of a sign of abnormality of the energy storage device or the power supply related apparatus.

11. The communication system according to claim 7, wherein the determination part determines whether a sign of abnormality has been detected on a basis of the state information of a group of the energy storage device.

12. An information processing method for processing information by a communication device connected to an energy storage device or a power supply related apparatus and an information processing apparatus that transmits and receives information to and from the communication device, wherein the communication device transmits, to the information processing apparatus, information including a state of the energy storage device or the power supply related apparatus acquired at a timing based on a setting, the information processing apparatus determines whether the timing needs to be changed, the information processing apparatus transmits to the communication device an instruction to change the timing when it is determined that the timing needs to be changed, and the communication device changes the timing on a basis of the received instruction for the change.

13. A computer program stored in a non-transitory computer readable medium, for receiving and displaying information of an energy storage device and/or a power supply related apparatus to a computer provided with a display part, the program causing the computer to perform:

requesting display information for displaying a state of the energy storage device and/or the power supply related apparatus, the display information being provided for each of systems including the energy storage device and/or the power supply related apparatus or for each of places where the energy storage device and/or the power supply related apparatus is installed;

collectively displaying the display information for each of the systems or for each of the places on a basis of the display information transmitted in response to the request;

communicatively connecting to a communication device on a basis of information of connection to the communication device connected to the energy storage device or the power supply related apparatus included in the display information; and displaying a screen that is provided from the communication device and accepts a change in a timing for acquiring information including the state in the energy storage device or the power supply related apparatus.

14. A capacity estimation system comprising:

an information processing apparatus that processes information including a state of an energy storage device;

a management apparatus that acquires voltage and current in the energy storage device; and a communication device including a first communication part that communicates with the management apparatus and a second communication part that communicates with the information processing apparatus or another apparatus, wherein the communication device includes:
an acceptance part that accepts an estimation instruction for a full-charge capacity of the energy storage device by using the second communication part; and
a transmission processing part that, when the acceptance part accepts the estimation instruction, transmits the voltage and current acquired from the management apparatus by using the first communication part and/or transmits a state of charge estimated on a basis of the voltage and current by using the second communication part, and the communication device changes a timing for acquiring the state in the management apparatus when the acceptance part accepts the estimation instruction.

15. The capacity estimation system according to claim 14, wherein the energy storage device includes a plurality of banks connected in parallel, and the second communication part transmits, to the information processing apparatus or another apparatus, identification information of a bank in which a full-charge capacity is being estimated and/or identification information of a domain including the bank.

16. The capacity estimation system according to claim 15, wherein each of the plurality of banks includes a switching part that switches connection or disconnection with a power line for electric connection to the energy storage device, and the management apparatus is provided for each of the plurality of banks and controls the switching part.

17. The capacity estimation system according to claim 16, wherein the communication device is provided so as to be communicable with each of the plurality of banks and instructs disconnection or connection in the switching part of a bank connected via the first communication part or in the switching part of another bank via another communication device.

18. The capacity estimation system according to claim 15, wherein a selection is made as to whether the full-charge capacity estimation is collectively performed for the plurality of banks or the full-charge capacity estimation is performed for a specific bank among the plurality of banks.

19. A communication device comprising:

a first communication part that is connected to an energy storage device and acquires information of voltage and/or current in the energy storage device;

a second communication part that communicates with another apparatus;

an acceptance part that accepts an estimation instruction for a full-charge capacity of the energy storage device through communication in the second communication part; and a processing part that, when the acceptance part accepts the estimation instruction, controls a switching part configured to switch connection or disconnection of a power line for electric connection to the energy storage device so as to start measurement of the voltage and current in the energy storage device, wherein a timing for acquiring a state in the energy storage device is changed when the acceptance part accepts the estimation instruction.

20. A computer program, stored in a non-transitory computer readable medium, for receiving and displaying information of an energy storage device to a computer provided with a display part, the program causing the computer to perform:

requesting display information displaying a state of the energy storage device;

displaying the state of the energy storage device on a basis of display information transmitted in response to the request;

communicatively connecting to a communication device on a basis of information of connection to the communication device connected to the energy storage device included in the display information; and displaying a screen that is provided from the communication device and accepts execution of estimation of a full-charge capacity of the energy storage device, wherein a timing for acquiring the state in the energy storage device is changed when the execution of the estimation is accepted.

* * * * *